(12) United States Patent
Ito et al.

(10) Patent No.: US 11,081,617 B2
(45) Date of Patent: Aug. 3, 2021

(54) SOLAR BATTERY DEVICE AND METHOD FOR MANUFACTURING SOLAR BATTERY DEVICE

(71) Applicant: KYOCERA CORPORATION, Kyoto (JP)

(72) Inventors: Norikazu Ito, Moriyama (JP); Kenji Fukuchi, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/660,530

(22) Filed: Oct. 22, 2019

(65) Prior Publication Data
US 2020/0052149 A1 Feb. 13, 2020

Related U.S. Application Data

(63) Continuation of application No. PCT/JP2018/014096, filed on Apr. 2, 2018.

(30) Foreign Application Priority Data

Apr. 27, 2017 (JP) .............................. JP2017-088210

(51) Int. Cl.
*H01L 31/18* (2006.01)
*H01L 31/0216* (2014.01)
(Continued)

(52) U.S. Cl.
CPC .... *H01L 31/1868* (2013.01); *H01L 31/02167* (2013.01); *H01L 31/02168* (2013.01);
(Continued)

(58) Field of Classification Search
None
See application file for complete search history.

(56) References Cited

U.S. PATENT DOCUMENTS 4,886,555 A 12/1989 Hackstein et al.
5,910,014 A * 6/1999 Iwasaki ........... H01L 31/022416
438/94
(Continued)

FOREIGN PATENT DOCUMENTS

WO 2015/182503 A1 12/2015

*Primary Examiner* — Devina Pillay
(74) *Attorney, Agent, or Firm* — Duane Morris LLP

(57) ABSTRACT

A solar battery device includes a semiconductor substrate and a covering part. The semiconductor substrate has a first semiconductor region and a second semiconductor region. The first semiconductor region is a first-conductivity-type semiconductor region located on a first surface of the semiconductor substrate. The second semiconductor region is a second-conductivity-type semiconductor region different from the first-conductivity-type and located on a second surface opposite from the first surface. The covering part is located on the first surface of the semiconductor substrate. The covering part has a laminated portion in which a plurality of layers including a passivation layer and an antireflection layer are present in a laminated state. In the laminated portion, the passivation layer includes a region in which a thickness decreases from an outer peripheral portion toward a central part of the first surface.

8 Claims, 8 Drawing Sheets

III-III

(51) Int. Cl.
*H01L 31/0236* (2006.01)
*H01L 31/0368* (2006.01)
*H01L 31/068* (2012.01)

(52) U.S. Cl.
CPC .. *H01L 31/02363* (2013.01); *H01L 31/03682* (2013.01); *H01L 31/0682* (2013.01); *H01L 31/182* (2013.01)

(56) References Cited

U.S. PATENT DOCUMENTS

| | | | |
|---|---|---|---|
| 2007/0045683 A1* | 3/2007 | Willemin | H01L 31/02161 257/292 |
| 2011/0253211 A1 | 10/2011 | Krokoszinski | |
| 2012/0247548 A1* | 10/2012 | Seo | H01L 31/1804 136/256 |
| 2013/0025665 A1* | 1/2013 | Lee | H01L 31/022425 136/256 |
| 2017/0077321 A1 | 3/2017 | Ito et al. | |

* cited by examiner

SOLAR BATTERY DEVICE AND METHOD FOR MANUFACTURING SOLAR BATTERY DEVICE

CROSS-REFERENCE TO RELATED APPLICATIONS

The present application is a continuation based on PCT Application No. PCT/JP2018/014096 filed on Apr. 2, 2018, which claims the benefit of Japanese Application No. 2017-088210, filed on Apr. 27, 2017. PCT Application No. PCT/JP2018/014096 is entitled "SOLAR BATTERY ELEMENT AND SOLAR BATTERY ELEMENT MANUFACTURING METHOD", and Japanese Application No. 2017-088210 is entitled "SOLAR BATTERY ELEMENT AND SOLAR BATTERY ELEMENT MANUFACTURING METHOD". The contents of which are incorporated by reference herein in their entirety.

FIELD

The present disclosure relates to a solar battery device and a method for manufacturing a solar battery device.

BACKGROUND

Solar battery devices include, for example, a crystalline solar battery device using a semiconductor substrate made of monocrystalline or polycrystalline silicon or the like. In such a crystalline solar battery device, for example, by making an antireflection film present on the light-receiving surface side of the semiconductor substrate and making a passivation layer present on the back-surface side of the semiconductor substrate, the photoelectric conversion efficiency can be improved.

SUMMARY

A solar battery device and a method for manufacturing a solar battery device are disclosed.

In one embodiment, a solar battery device includes a semiconductor substrate and a covering part. The semiconductor substrate includes a first semiconductor region and a second semiconductor region. The first semiconductor region is a first-conductivity-type semiconductor region located on a first surface of the semiconductor substrate. The second semiconductor region is a second-conductivity-type semiconductor region different from the first-conductivity-type and located on a second surface opposite from the first surface. The covering part is located on the first surface of the semiconductor substrate. The covering part has a laminated portion in which a plurality of layers including a passivation layer and an antireflection layer are present in a laminated state. In the laminated portion, the passivation layer includes a region in which a thickness decreases from an outer peripheral portion toward a central part of the first surface.

In one embodiment, a method for manufacturing a solar battery device includes: preparing a first semiconductor substrate and a second semiconductor substrate; and forming a passivation layer on a surface of each of the first semiconductor substrate and the second semiconductor substrate. The first semiconductor substrate and the second semiconductor substrate each include a first-conductivity-type first semiconductor region on a first surface and a second-conductivity-type second semiconductor region different from the first conductivity type and located on a second surface that is opposite from the first surface. The passivation layer is formed such that the first surface of the first semiconductor substrate and the first surface of the second semiconductor substrate are close to and face each other. The passivation layer is formed so as to include a region in which a thickness decreases from an outer peripheral portion toward a central part on the first surface of each of the first semiconductor substrate and the second semiconductor substrate.

DETAILED DESCRIPTION

Figure 1:
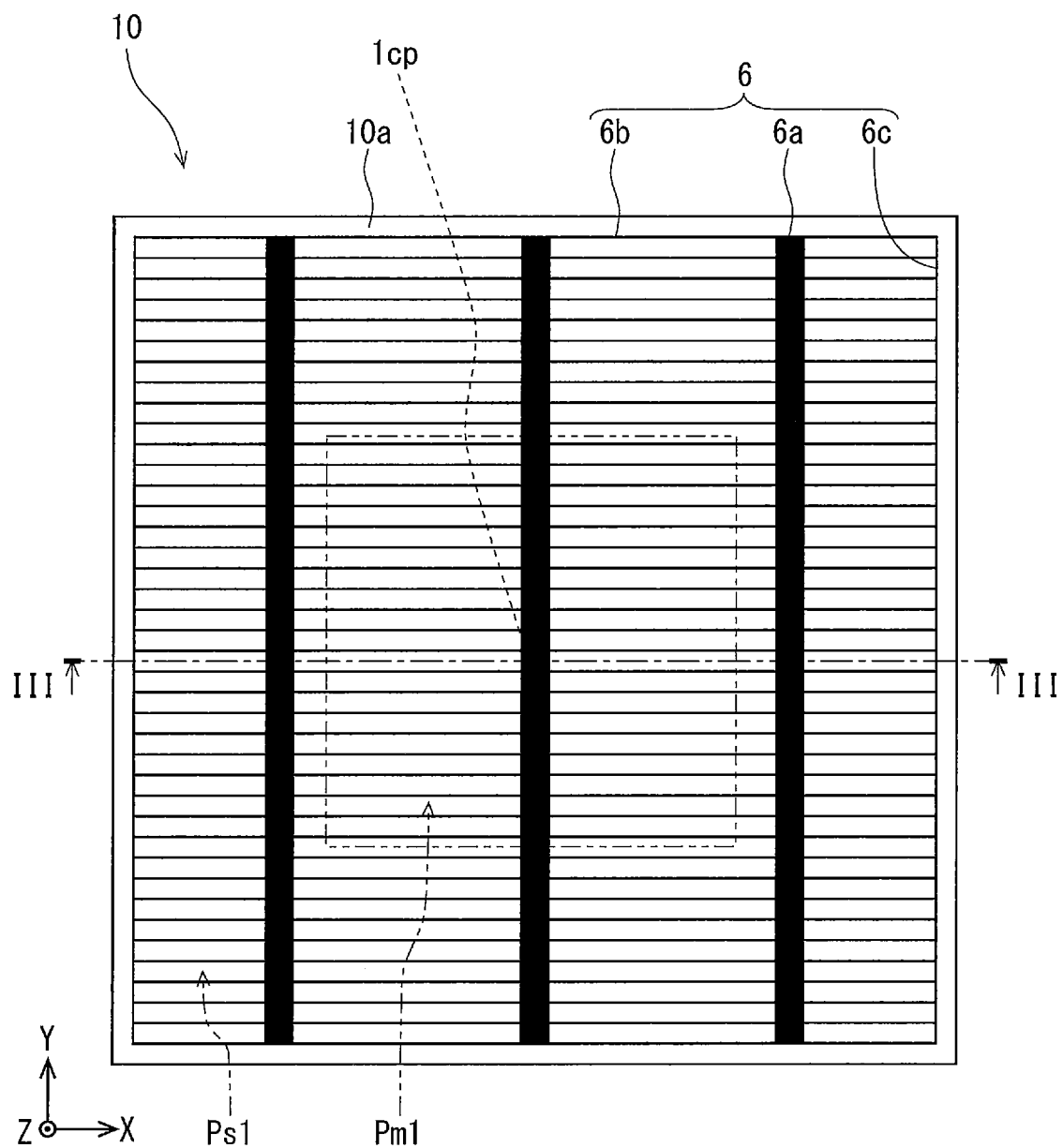
FIG. 1 illustrates a plan view showing an appearance of a light-receiving surface side in an example of a solar battery device according to a first embodiment.

Solar battery devices include, for example, a crystalline solar battery device using a semiconductor substrate made of monocrystalline or polycrystalline silicon or the like. In such a crystalline solar battery device, for example, when an antireflection film is made present on a light-receiving surface side of the semiconductor substrate and a passivation layer is made present on a back surface side of the semiconductor substrate opposite the light-receiving surface side, photoelectric conversion efficiency can be improved.

Here, for example, it is conceivable to form a dense passivation layer made of aluminum oxide or the like by using atomic layer deposition (ALD). In this case, for example, at the time of forming the passivation layer on the back surface of the semiconductor substrate by using ALD, the passivation layer can be formed on the entire surface of the semiconductor substrate. Therefore, for example, a layer having the same composition can be formed not only on the back surface of the semiconductor substrate but also on the light-receiving surface. From another viewpoint, a passivation layer can be formed on the back surface of the semiconductor substrate, and an antireflection film having the same composition as the passivation layer can be formed on the light-receiving surface of the semiconductor substrate.

However, in the crystalline solar battery device, for example, a region on the light-receiving surface side of the semiconductor substrate has a first conductivity type, and a region on the back-surface side of the semiconductor substrate which is opposite from the light-receiving surface has a second conductivity type reverse to the first conductivity type. Therefore, for example, a layer that produces an electric field passivation effect for reducing recombination of minority carrier in the region on the back-surface side of the semiconductor substrate might promote recombination of minority carrier in the region on the light-receiving surface side of the semiconductor substrate.

Here, for example, a case is assumed where the first conductivity type is n-type, the second conductivity type is p-type, and the passivation layer is made of aluminum oxide. In this case, for example, in the p-type region on the back-surface side of the semiconductor substrate, electrons as minority carriers hardly approach the back surface due to the negative fixed charge of aluminum oxide. On the other hand, for example, in the n-type region on the light-receiving surface side of the semiconductor substrate, holes as minority carriers are likely to approach the light-receiving surface due to the negative fixed charge of aluminum oxide. For this reason, the recombination of minority carrier might be promoted in the region on the light-receiving surface side of the semiconductor substrate.

In order to avoid such a problem, for example, a passivation layer may be formed on the back-surface side with the light-receiving surface side of the semiconductor substrate covered with a mask.

However, the solar battery device has room for improvement in terms of easily improving the photoelectric conversion efficiency.

Therefore, the inventors of the present disclosure have created a technology capable of easily improving the photoelectric conversion efficiency of the solar battery device.

Various embodiments regarding this will be described below with reference to the drawings. The same reference signs are allocated to components having similar structures and functions in the drawings, and the description thereof will not be repeated below. Further, the drawings are schematically shown. FIGS. 1 to 11 and FIGS. 14 to 17 each show a right-hand XYZ coordinate system. In this XYZ coordinate system, a longitudinal direction of an output extracting electrode 6a on a first device surface 10a as a light-receiving surface of a solar battery device 10, described later, is a +Y direction, a short direction of the output extracting electrode 6a is a +X direction, and a normal direction of the first device surface 10a is a +Z direction. Moreover, in FIGS. 4, 14, 15, and 17, the illustration of an uneven structure (texture) and a first electrode 6, described later, is omitted. In FIGS. 3 and 6 to 10, unevenness of a texture in a first surface 1a of a semiconductor substrate 1 is emphasized.

1. First Embodiment 1-1. Solar Battery Device

The configuration of a solar battery device 10 according to a first embodiment will be described with reference to FIGS. 1 to 4. Here, a passivated emitter rear cell (PERC) type solar battery device will be described as an example of the solar battery device 10.

Figure 2:
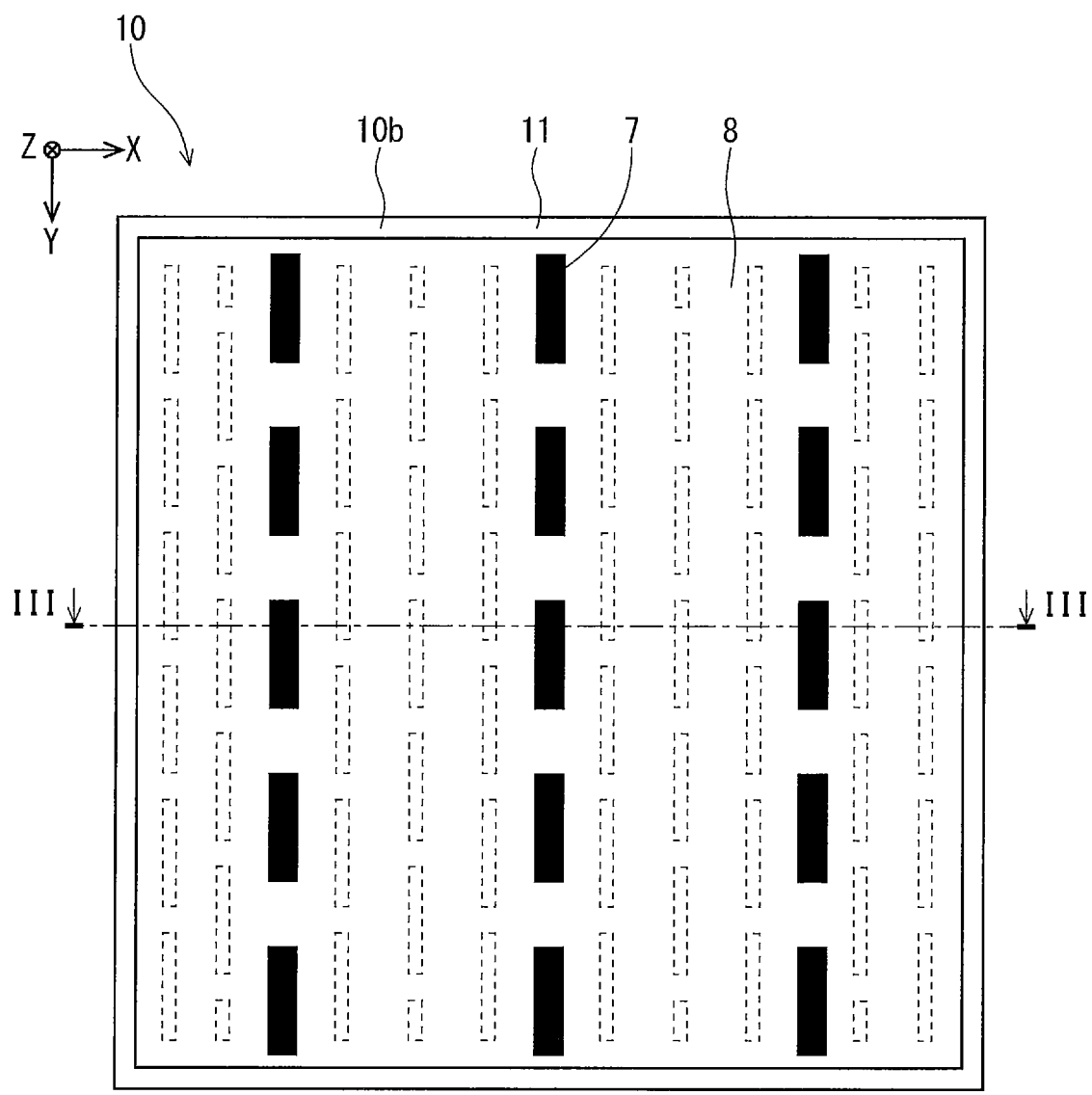
FIG. 2 illustrates a back view showing an appearance of a back-surface side in an example of the solar battery device according to the first embodiment.
Figure 3:
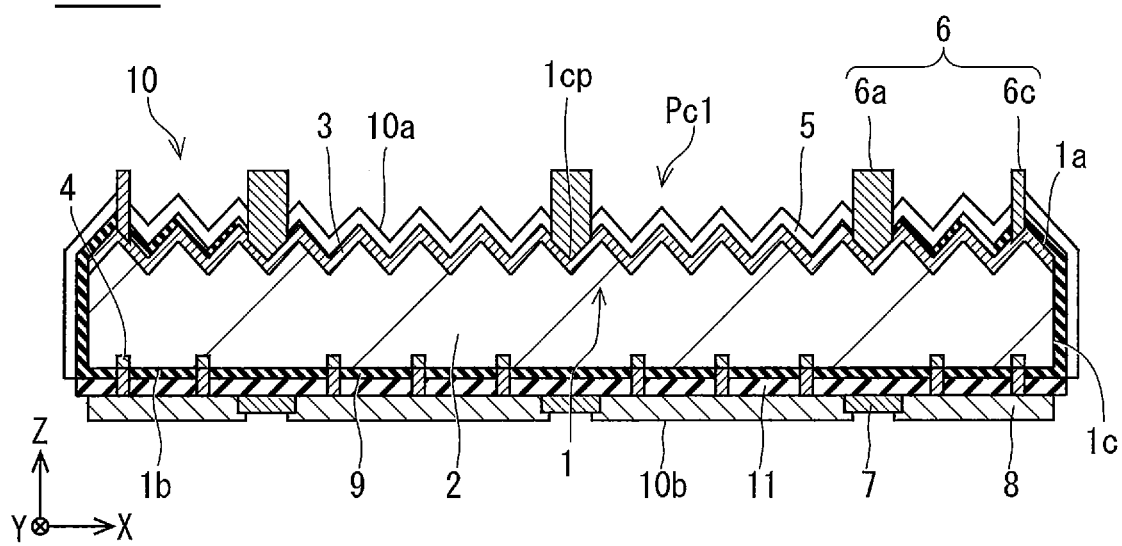
FIG. 3 illustrates a drawing showing a virtual cut section of the solar battery device taken along line of FIGS. 1 and 2.

As shown in FIGS. 1 to 3, the solar battery device 10 has, for example, a first device surface 10a that is a light-receiving surface (also referred to as a front surface) which light mainly enters, and a second device surface 10b which is a back surface located opposite the first device surface 10a. The solar battery device 10 includes, for example, a semiconductor substrate 1. The semiconductor substrate 1 has, for example, a first surface 1a, a second surface 1b located opposite the first surface 1a, and a third surface 1c as a side surface located in the state of connecting the first surface 1a and the second surface 1b. The semiconductor substrate 1 includes, for example, a first conductivity-type (n-type in the first embodiment) first semiconductor region 3 located on the first surface 1a side and a second conductivity-type (p-type in the first embodiment) second semiconductor region 2 located on the second surface 1b side different from the first conductivity type. Furthermore, the solar battery device 10 further includes, for example, a third semiconductor region 4, an antireflection layer 5, a first electrode 6, a second electrode 7, a third electrode 8, a passivation layer 9, and a protective layer 11.

The semiconductor substrate 1 is, for example, a monocrystalline or polycrystalline silicon substrate (also referred to as a silicon substrate). The semiconductor substrate 1 may be made of a material other than silicon so long as the semiconductor substrate 1 is a semiconductor substrate that includes the first semiconductor region 3 and the second semiconductor region 2 as described above.

Hereinafter, the case of applying a p-type semiconductor to the second semiconductor region 2 will be described. In this case, for example, a p-type silicon substrate is used as the semiconductor substrate 1. The thickness of the silicon substrate may, for example, be 250 μm or less or may further be 150 µm or less. The shape of the semiconductor substrate 1 is not particularly limited. However, for example, when the shape of the semiconductor substrate 1 in a plan view is rectangular, at the time of manufacturing a solar battery module by arranging a plurality of solar battery devices 10, a gap between the adjacent solar battery devices 10 can be made smaller. In a case where the second semiconductor region 2 in the state of comprising of a polycrystalline silicon substrate is of the p-type, for example, impurities such as boron or gallium are contained in the semiconductor substrate 1 as dopant elements.

The first semiconductor region 3 is located in the state of being laminated on the second semiconductor region 2. From another viewpoint, the first semiconductor region 3 is located on the first surface 1a side of the semiconductor substrate 1. When the first semiconductor region 3 has an opposite conductivity type (n-type) to the second semiconductor region 2, a p-n junction is present in an interface between the first semiconductor region 3 and the second semiconductor region 2 in the semiconductor substrate 1. The first semiconductor region 3 can be formed, for example, by introducing an impurity element such as phosphorus as a dopant into a surface layer part on the first surface 1a side of the semiconductor substrate 1 by diffusion.

As shown in FIG. 3, on the first surface 1a side of the semiconductor substrate 1, a fine texture for reducing the reflectance of irradiation light may be present. The height of each of protrusions in the texture is, for example, approximately 0.1 µm to 10 µm. The length between the apexes of adjacent protrusions of the texture is, for example, approximately 0.1 µm to 20 µm. In the texture, for example, recesses may each be substantially spherical, and the protrusions may each be pyramidal. The "height of each of protrusions" described above means, for example in FIG. 3, a distance between the apex of the protrusion and a reference line that is defined as an imaginary straight line passing through the bottoms of the recesses, in a direction perpendicular to the reference line.

The antireflection layer 5 has, for example, a function of reducing the reflectance of light with which the first device surface 10a of the solar battery device 10 is irradiated. For example, silicon nitride, silicon oxide, or the like is applied to the material of the antireflection layer 5. The refractive index and the thickness of the antireflection layer 5 may only be appropriately adopted to satisfy low-reflection conditions for light of sunlight whose wavelength range can contribute to electric power generation through absorption into the semiconductor substrate 1. The antireflection layer 5, for example, having a refractive index of approximately 1.8 to 2.5 and a thickness of approximately 20 nm to 120 nm can be employed.

The third semiconductor region 4 is located on the second surface 1b side of the semiconductor substrate 1. The conductivity type of the third semiconductor region 4 may only be the same as that of the second semiconductor region 2 (p-type in the first embodiment). The concentration of the dopant contained in the third semiconductor region 4 is higher than the concentration of the dopant contained in the second semiconductor region 2. In other words, in the third semiconductor region 4, dopant elements are present having a higher concentration than that of the dopant elements in the second semiconductor region 2 having been doped to cause the second semiconductor region 2 to have the second conductivity type. Hence the semiconductor substrate 1 includes a semiconductor region having p-type conductivity (also referred to as a p-type semiconductor region) at the second surface 1b, for example. The third semiconductor region 4 can form an internal electric field on the second surface 1b side of the semiconductor substrate 1, for example. Thereby, for example, in the vicinity of the second surface 1b of the semiconductor substrate 1, reduction of photoelectric conversion efficiency by recombination of electrons that are minority carriers is less likely to occur. The third semiconductor region 4 can be formed by, for example, diffusing dopant elements such as boron or aluminum in the surface layer part on the second surface 1b side of the semiconductor substrate 1. Here, the concentration of the dopant elements contained in the second semiconductor region 2 can be set to approximately $5 \times 10^{15}$ atoms/cm$^3$ to $1 \times 10^{17}$ atoms/cm$^3$, and the concentration of the dopant elements contained in the third semiconductor region 4 can be set to approximately $1 \times 10^{18}$ atoms/cm$^3$ to $5 \times 10^{21}$ atoms/cm$^3$. The third semiconductor region 4 is present, for example, at a contact portion between the third electrode 8 to be described later and the semiconductor substrate 1.

The first electrode 6 is an electrode located on the first surface 1a side of the semiconductor substrate 1. As shown in FIG. 1, the first electrode 6 includes an output extracting electrode 6a and a plurality of linear collecting electrodes 6b. The output extracting electrode 6a is an electrode for externally extracting electricity obtained by electric power generation. The length in the short direction (also referred to as a width) of the output extracting electrode 6a is, for example, approximately 1.3 mm to 2.5 mm. At least a part of the output extracting electrodes 6a crosses and is electrically connected to the collecting electrodes 6b. The collecting electrode 6b is an electrode for collecting the electricity obtained by electric power generation performed by the semiconductor substrate 1. The width of each of the collecting electrodes 6b is, for example, approximately 50 µm to 200 µm. As described above, the width of the collecting electrode 6b is smaller than the width of the output extracting electrode 6a. Further, the plurality of collecting electrodes 6b are located in the state of being arranged so as to have a space of approximately 1 mm to 3 mm therebetween, for example. The thickness of the first electrode 6 is, for example, approximately 10 µm to 40 µm. The first electrode 6 can be formed, for example, by applying a metal paste that contains silver as a main component into a desired shape by screen printing or the like and then firing the metal paste. In the present specification, the main component means a component contained in the largest (highest) ratio (also referred to as content ratio). Here, for example, auxiliary electrodes 6c having a shape similar to those of the collecting electrodes 6b may be located along the longitudinal direction of the output extracting electrode 6a in the vicinity of the peripheral edge of the semiconductor substrate 1 to electrically connect the collecting electrodes 6b to each other.

The second electrode 7 and the third electrode 8 are located on the second surface 1b side of the semiconductor substrate 1 as shown in FIGS. 2 and 3.

The second electrode 7 is an electrode for externally extracting electricity obtained by electric power generation performed by the solar battery device 10. The thickness of the second electrode 7 is, for example, approximately 10 µm to 30 µm. The width of the second electrode 7 is, for example, approximately 1.3 mm to 7 mm. Further, the second electrode 7 contains silver as a main component. The second electrode 7 can be formed, for example, by applying a metal paste that contains silver as a main component into a desired shape by screen printing or the like and then firing the metal paste.

As shown in FIGS. 2 and 3, the third electrode 8 is an electrode for collecting electricity generated by the semiconductor substrate 1 on the second surface 1b side of the semiconductor substrate 1. In addition, the third electrode 8 is located in the state of being electrically connected to the second electrode 7. At least a part of the second electrode 7 may only be connected to the third electrode 8. The thickness of the third electrodes 8 is, for example, approximately 15 μm to 50 μm. Further, the third electrode 8 contains aluminum as a main component. The third electrode 8 can be formed, for example, by applying a metal paste that contains aluminum as a main component into a desired shape by screen printing or the like and then firing the metal paste.

Figure 4:
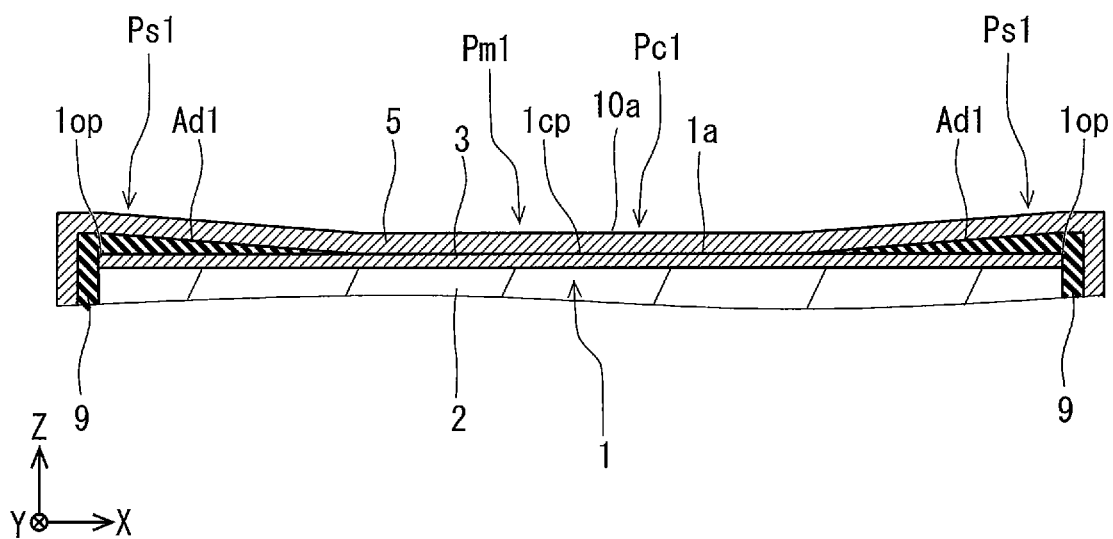
FIG. 4 illustrates a drawing schematically showing a virtual cut section of a portion on a first surface side of the solar battery device according to the first embodiment.

The passivation layer 9 is a layer for making the surface of the semiconductor substrate 1 inactive. As the material of the passivation layer 9, for example, aluminum oxide or the like is adopted. As shown in FIG. 3, in the first embodiment, the passivation layer 9 includes a portion located on the first surface 1a side of the semiconductor substrate 1, for example. As shown in FIGS. 1, 3, and 4, the solar battery device 10 includes a covering part Pc1 located on the first surface 1a side of the semiconductor substrate 1. As shown in FIG. 4, the covering part Pc1 includes a portion (also referred to as a laminated portion) Ps1 present in a state where a plurality of layers including the passivation layer 9 and the antireflection film 5 are laminated. In the laminated portion Ps1, the passivation layer 9 includes a region (also referred to as variable thickness region) Ad1 in which the thickness decreases from an outer peripheral portion 1op side toward a central part 1cp side on the first surface 1a. The variable thickness region Ad1 can be easily formed, for example, by a method for manufacturing the solar battery device 10 to be described later.

In the example of FIGS. 1 to 4, the shape of each of the first surface 1a and the second surface 1b of the semiconductor substrate 1 is a square having a side length of about 156 mm. In addition, a region where the passivation layer 9 is present on the first surface 1a is an annular region of approximately 15 mm to 40 mm from the outer peripheral portion 1op. From another viewpoint, the region where the passivation layer 9 is present on the first surface 1a is set, for example, to approximately 20% to 50% of the distance between the outer peripheral portion 1op and the central part 1cp, from the outer peripheral portion 1op. For this reason, as shown in FIG. 1, when the first device surface 10a is seen in a plan view, the solar battery device 10 includes a region (also referred to as a non-presence region) Pm1 where the passivation layer 9 is not present in the central part 1cp and the region therearound.

The thickness of the passivation layer 9 can be measured, for example, by a spectroscopic ellipsometer. However, in the measurement of the thickness by the spectroscopic ellipsometer, a measured value of a thickness of less than approximately several nm to less than approximately 5 nm can be inaccurate, depending on the measurement accuracy. Therefore, for the measured value in the distribution of the thickness of the passivation layer 9 on the first surface 1a side of the semiconductor substrate 1, for example, a correction may be appropriately made to subtract an incorrect value as an offset value from each measured value. Here, the offset value may, for example, be a fixed lower limit in measurement accuracy, or may be determined based on the measured value obtained by the spectroscopic ellipsometer and the presence or absence of the distinguishable passivation layer 9 in accordance with visual recognition of a change in color tone for the first device surface 10a. Further, for example, when a measured value obtained by measuring the thickness with the spectroscopic ellipsometer and being a certain value (e.g., 10 nm) or more matches an actual thickness recognized by observation of the cross section or the like, the measured value being the certain value or more does not need be corrected.

For example, in the semiconductor substrate 1, the density of crystal defects generated at the time of preparing a semiconductor ingot by casting and at the time of cutting the semiconductor ingot increases toward the outer peripheral portion 1op. For example, in the semiconductor substrate 1, the density of crystal defects increases toward the outer peripheral portion 1op in the region of approximately 30 mm from the outer peripheral portion 1op due to the influence at the time of manufacturing the semiconductor ingot by casting. Moreover, for example, in the semiconductor substrate 1, the density of crystal defects increases toward the outer peripheral portion 1op in the region of approximately 15 mm from the outer peripheral portion 1op due to the influence at the time of cutting the semiconductor ingot.

Therefore, in the first embodiment, for example, on the first surface 1a side of the semiconductor substrate 1, the passivation layer 9 is located such that the thickness increases toward the outer peripheral portion 1op side of the first surface 1a, corresponding to the density of the crystal defects. For example, there is considered a configuration in which in a region of approximately 15 mm to 30 mm from the outer peripheral portion 1op of the first surface 1a, the passivation layer 9 is located such that the thickness increases toward the outer peripheral portion 1op side of the first surface 1a. In this case, for example, on the surface of the semiconductor substrate 1, the inactivation of crystal defects is achieved by termination of dangling bonds or the like due to the presence of the passivation layer 9. Thereby, for example, at the time of electric power generation in the solar battery device 10 in accordance with irradiation with sunlight, the recombination of minority carrier can be reduced on the first surface 1a side of the semiconductor substrate 1. Hence it is possible to easily improve the photoelectric conversion efficiency in the solar battery device 10.

Here, as the passivation layer 9, for example, silicon oxide or aluminum oxide is adopted. In this case, for example, when the passivation layer 9 is in contact with the first surface 1a of the semiconductor substrate 1 in the laminated portion Ps1, a dangling bond (a dangling bond of silicon) on the outermost surface of the semiconductor substrate 1 is bonded with oxygen and silicon or oxygen and aluminum. For example, the Si—O—Si bond in which oxygen and silicon are bonded to the silicon dangling bond (Si—), or the Si—O—Al bond in which oxygen and aluminum are bonded to the silicon dangling bond (Si—), is generated. Thereby, for example, at the time of electric power generation in the solar battery device 10 in accordance with irradiation with sunlight, the recombination of minority carrier can be reduced on the first surface 1a side of the semiconductor substrate 1. As a result, it is possible to easily improve the photoelectric conversion efficiency in the solar battery device 10.

Here, for example, when the aluminum oxide in the state of constituting the passivation layer 9 is formed by, for example, ALD or the like, the passivation layer 9 can be dense. In this case, for example, the inactivation of crystal defects is achieved by sufficient termination of dangling bonds or the like on the outer peripheral portion 1op side of the first surface 1a of the semiconductor substrate 1 and its vicinity. As a result, it is possible to easily improve the photoelectric conversion efficiency in the solar battery device 10.

Further, for example, in a case where the antireflection layer 5 is formed on the passivation layer 9 by chemical vapor deposition (CVD) or the like, the presence of the passivation layer 9 makes the surface of the semiconductor substrate 1 resistant to damage caused by plasma or the like. Therefore, for example, impurities are hardly mixed in the surface layer part of the semiconductor substrate 1, and defects are hardly formed in the surface layer part of the semiconductor substrate 1. As a result, on the first surface 1a side of the semiconductor substrate 1, the recombination of minority carrier hardly occurs due to the presence of the passivation layer 9. Therefore, it is possible to easily improve the photoelectric conversion efficiency in the solar battery device 10, for example.

In addition, for example, when a structure in which the passivation layer 9 and the antireflection layer 5 are in contact with each other is adopted in the laminated portion Ps1, the laminated portion Ps1 has a simple structure. For this reason, for example, it becomes easy to adjust the change in reflectance on the first device surface 10a of the solar battery device 10 due to the change in thickness of the passivation layer 9. Therefore, for example, since the changes in reflectance of the outer peripheral portion 1op and the central part 1cp in the solar battery device 10 can be reduced, the photoelectric conversion efficiency is less likely to deteriorate.

Further, for example, on the first device surface 10a side of the solar battery device 10, the laminated portion Ps1 may be located such that the reflectance related to the wavelength range from blue light to ultraviolet light decreases from the outer peripheral portion 1op side toward the central part 1cp side of the first surface 1a. Here, as a wavelength range from blue light to ultraviolet light, for example, a wavelength range of 300 nm to 500 nm is adopted. In this case, for example, on the first device surface 10a side of the solar battery device 10, even when the reflectance increases to some extent due to the presence of the passivation layer 9 on the outer peripheral portion 1op side, the reflectance on the central part 1cp side and its periphery can decrease. For this reason, for example, as compared with a case where the thickness of the passivation layer 9 remains unchanged on the first surface 1a side of the solar battery device 10, the photoelectric conversion efficiency is less likely to deteriorate.

Moreover, for example, when the passivation layer 9 is formed by ALD or the like, the density of hydrogen contained in the passivation layer 9 can be high. Thereby, for example, on the first surface 1a side of the semiconductor substrate 1, the inactivation of crystal defects is easily achieved by the termination of dangling bonds in the outer peripheral portion 1op and its vicinity due to hydrogen contained in the passivation layer 9. Therefore, for example, the recombination of minority carrier hardly occurs on the first surface 1a side of the semiconductor substrate 1. As a result, for example, the photoelectric conversion efficiency in the solar battery device 10 can be improved.

Further, in the first embodiment, for example, as shown in FIG. 3, the passivation layer 9 includes a portion located on the second surface 1b side of the semiconductor substrate 1. The thickness of the passivation layer 9 on the second surface 1b side is, for example, approximately 10 nm to 200 nm. In this case, for example, on the second surface 1b side of the semiconductor substrate 1, the inactivation of crystal defects due to the termination of dangling bonds or the like makes the recombination of minority carriers (here, electrons) less likely to occur. It is thus possible to easily improve the photoelectric conversion efficiency in the solar battery device 10, for example. Moreover, for example, the passivation layer 9 can have a negative fixed charge when the passivation layer 9 is mainly made of aluminum oxide. In this case, the minority carriers on the second surface 1b side of the semiconductor substrate 1 are separated from the second surface 1b which is the interface between the p-type second semiconductor region 2 and the passivation layer 9 by the field effect. Therefore, for example, in the portion on the second surface 1b side of the semiconductor substrate 1, the recombination of minority carrier hardly occurs due to the electric field passivation effect produced by the passivation layer 9. Therefore, the inactivation of crystal defects due to the termination of dangling bonds is performed by the passivation layer 9 on both the first surface 1a side and the second surface 1b side of the semiconductor substrate 1. Moreover, on the second surface 1b side of the semiconductor substrate 1, the electric field passivation effect can be obtained by the passivation layer 9. As a result, for example, the photoelectric conversion efficiency in the solar battery device 10 can be improved.

In the first embodiment, for example, as shown in FIG. 3, the passivation layer 9 includes a portion located not only on the first surface 1a side and the second surface 1b side of the semiconductor substrate 1 but also on the third surface 1c side. The thickness of the passivation layer 9 on the third surface 1c side is, for example, approximately 10 nm to 200 nm. In this case, for example, on the third surface 1c side of the semiconductor substrate 1, the inactivation of crystal defects due to the termination of dangling bonds or the like makes the recombination of minority carrier less likely to occur. It is thus possible to easily improve the photoelectric conversion efficiency in the solar battery device 10, for example. Further, for example, when the surface layer part on the third surface 1c side of the semiconductor substrate 1 is a p-type semiconductor region, also on the third surface 1c side, the recombination of minority carrier hardly occurs due to the electric field passivation effect produced by the passivation layer 9. As a result, for example, the photoelectric conversion efficiency in the solar battery device 10 can be improved.

Moreover, for example, as shown in FIGS. 1, 3, and 4, a form is adopted in which the passivation layer 9 is not located on the central part 1cp when the first device surface 10a of the solar battery device 10 and the first surface 1a of the semiconductor substrate 1 are seen in perspective plan view. In this case, the non-presence region Pm1 described above is present. In the examples of FIGS. 3 and 4, the antireflection layer 5 is located in contact with the central part 1cp of the first surface 1a. In this case, for example, even in a state where the passivation layer 9 is made of aluminum oxide having a negative fixed charge, in the central part 1cp of the first semiconductor region 3 of the first conductivity type (n-type), a defect that the passivation layer 9 causes the minority carriers to be easily recombined hardly occurs. Thereby, for example, it is possible to easily improve the photoelectric conversion efficiency in the solar battery device 10 as compared with a structure in which the passivation layer 9 is formed on the entire first surface 1a of the solar battery device 10. Further, when a simple configuration in which the antireflection layer 5 is located in contact with the central part 1cp is adopted, the adjustment of the reflectance on the first device surface 10a of the solar battery device 10 becomes easy. Therefore, for example, since the changes in reflectance of the outer peripheral portion 1op and the central part 1cp in the solar battery device 10 can be reduced, the photoelectric conversion efficiency is less likely to deteriorate.

The protective layer 11 is, for example, located above the second semiconductor region 2 of the semiconductor substrate 1 as shown in FIG. 3. As the material of the protective layer 11, for example, silicon nitride, silicon oxide, or the like is adopted. The protective layer 11 can be formed, for example, by forming a silicon nitride layer by CVD to be described later. In this case, the thickness of the protective layer 11 is changed in accordance with, for example, the size of the unevenness of the second surface 1b of the semiconductor substrate 1, the type or content of the glass frit contained in the metal paste, the firing conditions at the time of forming the third electrode 8, and the like. The thickness of the protective layer 11 is, for example, approximately 50 nm to 800 nm.

In addition, the solar battery device 10 has a hole located in the state of penetrating the passivation layer 9 and the protective layer 11 and reaching the second surface 1b of the semiconductor substrate 1. That is, the passivation layer 9 and the protective layer 11 are not present on the second surface 1b of the semiconductor substrate 1 in the region where the hole is located. The cross-sectional shape of such a hole may, for example, be a dot (point) shape, or may be a band (line) shape as shown in FIG. 2. In this case, the diameter or width of the hole may only be approximately 10 μm to 500 μm, for example. The distance between the centers of adjacent holes in a perspective plan view (also referred to as a pitch of the holes) is, for example, approximately 0.3 mm to 3 mm.

Here, for example, when a metal paste containing aluminum for forming the third electrode 8 as a main component is applied onto the protective layer 11 in desired shape and fired, the third electrode 8 is electrically connected to the semiconductor substrate 1. At this time, aluminum is diffused from the metal paste to the surface layer part of the second surface 1b of the semiconductor substrate 1, whereby the third semiconductor region 4 is formed. On the other hand, the metal paste does not fire through the passivation layer 9 in a region of the passivation layer 9 covered with the protective layer 11. Therefore, the passivation effect produced by the passivation layer 9 is hardly reduced Thus, when the protective layer 11 is located on the passivation layer 9 on the second surface 1b side of the semiconductor substrate 1, for example, the occurrence of firing through the passivation layer 9 by the material for forming the third electrode 8, and the like, can be reduced. Thereby, for example, the passivation layer 9 can be sufficiently present on the second surface 1b side of the semiconductor substrate 1. In addition, for example, at the time of using the solar battery device 10, the presence of the protective layer 11 makes moisture, acid and the like less likely to reach the passivation layer 9. Hence it is possible to reduce the deterioration in the passivation layer 9 due to the moisture, acid and the like.

Further, for example, the protective layer 11 may be present not only on the passivation layer 9 located on the second surface 1b side of the semiconductor substrate 1 but also on the passivation layer 9 located on the third surface 1c side and the first surface 1a side of the semiconductor substrate 1. In this case, the presence of the protective layer 11 can reduce generation of a leak current in the solar battery device 10.

In addition, for example, between the p-type semiconductor region (second semiconductor region 2) and the passivation layer (also referred to as a first passivation layer) 9 containing aluminum oxide, another passivation layer (also referred to as a second passivation layer) containing silicon oxide may be present. Thereby, the passivation performance on the second surface 1b side of the semiconductor substrate 1 can be improved. Here, for example, when the thickness of the second passivation layer is approximately 0.1 nm to 1 nm, even when the second passivation layer configured using silicon oxide has a positive fixed charge, the electric field passivation effect produced by the first passivation layer 9 is less likely to deteriorate on the second surface 1b side.

Furthermore, for example, the third electrode 8 may be located on the second surface 1b of the solar battery device 10, in the state of having a shape like the collecting electrode 6b and being connected to the second electrode 7. With such a structure, for example, reflected light from the ground or the like, having entered the second device surface 10b side of the solar battery device 10, can also contribute to electric power generation to improve the output of the solar battery device 10.

Moreover, for example, a layer of silicon oxide (also referred to as a silica layer) formed by ALD may be present between the passivation layer 9 containing aluminum oxide as a main component and the protective layer 11. This silica layer can be a layer denser than the protective layer 11 when formed by ALD. Such a silica layer functions, for example, as a buffer layer between the passivation layer 9 and the protective layer 11 by being present between the passivation layer 9 and the protective layer 11. Thereby, adhesion between the passivation layer 9 and the protective layer 11 is further improved. Here, for example, if the thickness of the silica layer is smaller than the thickness of the passivation layer 9, even when the silica layer has a positive fixed charge, the electric field passivation effect produced by the negative fixed charge of the passivation layer 9 is less likely to deteriorate. Specifically, the thickness of the silica layer is, for example, approximately 5 nm to 15 nm.

1-2. Method for Manufacturing Solar Battery Device

Each step of the method for manufacturing the solar battery device 10 will be described in detail with reference to FIGS. 5 to 11.

Figure 5:
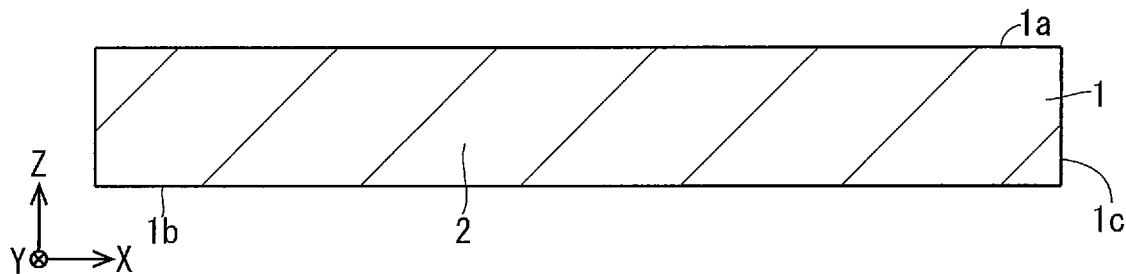
FIG. 5 illustrates a drawing showing an example of a state in the middle of manufacturing in a portion corresponding to the virtual cut section of FIG. 3 in the solar battery device according to the first embodiment.

First, as shown in FIG. 5, the semiconductor substrate 1 is prepared. The semiconductor substrate 1 is formed by, for example, the Czochralski (CZ) method, casting, or the like, which is an existing method. Hereinafter, an example will be described where a p-type polycrystalline silicon substrate is used as the semiconductor substrate 1. Here, for example, an ingot of polycrystalline silicon is prepared by casting. Next, the ingot is cut into slices each having a thickness of 250 μm or less, for example, to prepare the semiconductor substrate 1. Then, in order to remove a mechanically damaged layer and a contaminated layer of the cut section of the semiconductor substrate 1, the surface of the semiconductor substrate 1 may be slightly etched with an aqueous solution of NaOH, KOH, hydrofluoric acid, hydrofluoric-nitric acid, or the like.

Figure 6:
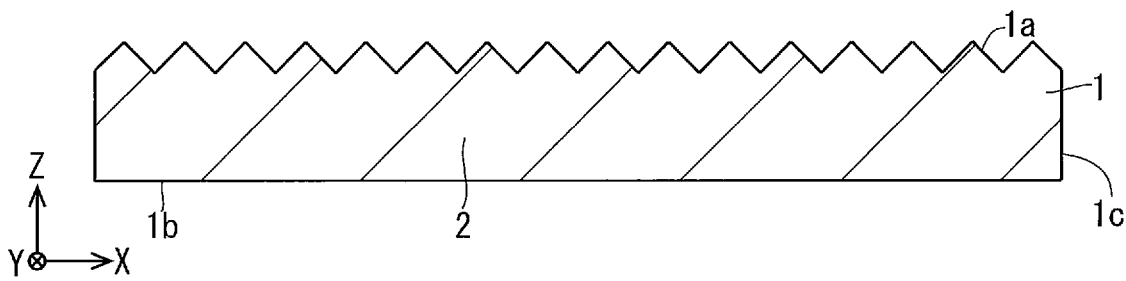
FIG. 6 illustrates a drawing showing an example of the state in the middle of manufacturing in the portion corresponding to the virtual cut section of FIG. 3 in the solar battery device according to the first embodiment.

Next, as shown in FIG. 6, a texture is formed on the first surface 1a of the semiconductor substrate 1. As a method for forming the texture, for example, wet etching using an alkaline solution of NaOH or the like or an acid solution of hydrofluoric-nitric acid or the like, or dry etching using reactive ion etching (RIE) or the like, can be used.

Figure 7:
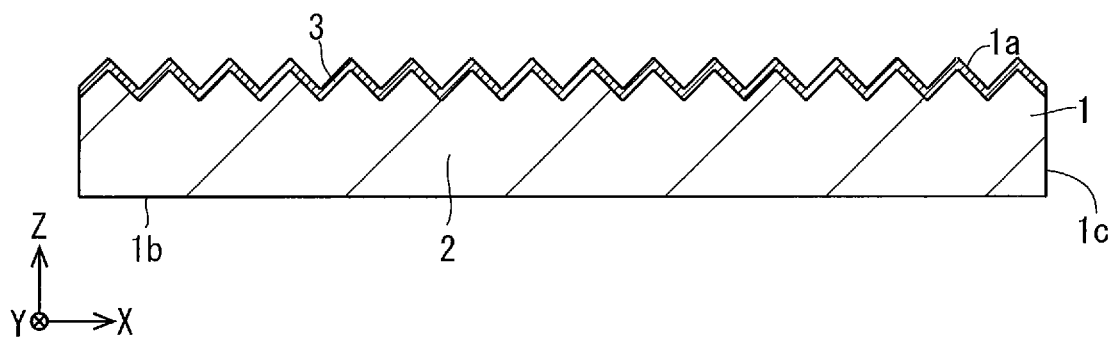
FIG. 7 illustrates a drawing showing an example of the state in the middle of manufacturing in the portion corresponding to the virtual cut section of FIG. 3 in the solar battery device according to the first embodiment.

Next, as shown in FIG. 7, the first semiconductor region 3 which is an n-type semiconductor region is formed on the first surface 1a side of the semiconductor substrate 1 having the texture formed in the above step. Specifically, the n-type first semiconductor region 3 is formed in the surface layer part on the first surface 1a side of the semiconductor substrate 1 having the texture. The first semiconductor region 3 can be formed by, for example, application thermal diffusion in which a $P_2O_5$ (diphosphorus pentaoxide) paste is applied onto the first surface 1a of the semiconductor substrate 1 and phosphorus is thermally diffused, gas phase thermal diffusion using a $POCl_3$ (phosphorus oxychloride) gas as a diffusion source, or the like. The first semiconductor region 3 is formed so as to have a depth of approximately 0.1 µm to 2 µm and a sheet-resistance of approximately 40Ω/□ to 200Ω/□, for example. For example, in the gas phase thermal diffusion, the semiconductor substrate 1 is thermally treated in an atmosphere including a diffused gas that contains $POCl_3$ and the like in a temperature range of approximately 600° C. to 800° C. for approximately 5 minutes to 30 minutes to form phosphorus glass on the surface of the semiconductor substrate 1. The semiconductor substrate 1 is then thermally treated in an atmosphere of an inert gas such as argon or nitrogen at a high temperature of approximately 800° C. to 900° C. for approximately 10 minutes to 40 minutes. At this time, phosphorus is diffused from the phosphorus glass into the surface layer of the semiconductor substrate 1, and the first semiconductor region 3 is formed on the first surface 1a side of the semiconductor substrate 1.

Here, when the first semiconductor region 3 is also formed on the second surface 1b side at the time of forming the first semiconductor region 3, for example, the first semiconductor region 3 formed on the second surface 1b side is removed by etching to expose the p-type second semiconductor region 2 on the second surface 1b side. Here, for example, the first semiconductor region 3 formed on the second surface 1b side of the semiconductor substrate 1 can be removed by immersing the second surface 1b side of the semiconductor substrate 1 into a hydrofluoric-nitric acid solution. The phosphorus glass adhering to the first surface 1a side of the semiconductor substrate 1 is then removed by etching. As described above, when phosphorus glass is left on the first surface 1a side and the first semiconductor region 3 formed on the second surface 1b side is removed by etching, the first semiconductor region 3 on the first surface 1a side is hardly removed and resistant to damage. Here, the first semiconductor region formed on the third surface 1c of the semiconductor substrate 1 may also be removed.

At the time of forming the first semiconductor region 3, for example, a diffusion mask may be formed in advance on the second surface 1b side, the first semiconductor region 3 may be formed by gas phase thermal diffusion or the like, and subsequently, the diffusion mask may be removed. A structure similar to the above can be formed by such a process as well. In this case, the step of removing the first semiconductor region 3 on the second surface 1b side is unnecessary because the first semiconductor region 3 is not formed on the second surface 1b side.

Thus, it is possible to prepare the polycrystalline semiconductor substrate 1 including the first semiconductor region 3 of the first conductivity type (here, n-type) present on the first surface 1a side and the second semiconductor region 2 of the second conductivity type (here, p-type) present on the second surface 1b side. Here, for example, a plurality of semiconductor substrates 1 having a similar structure can be prepared. The plurality of semiconductor substrates 1 include, for example, a first semiconductor substrate 1fi and a second semiconductor substrate 1se.

Figure 8:
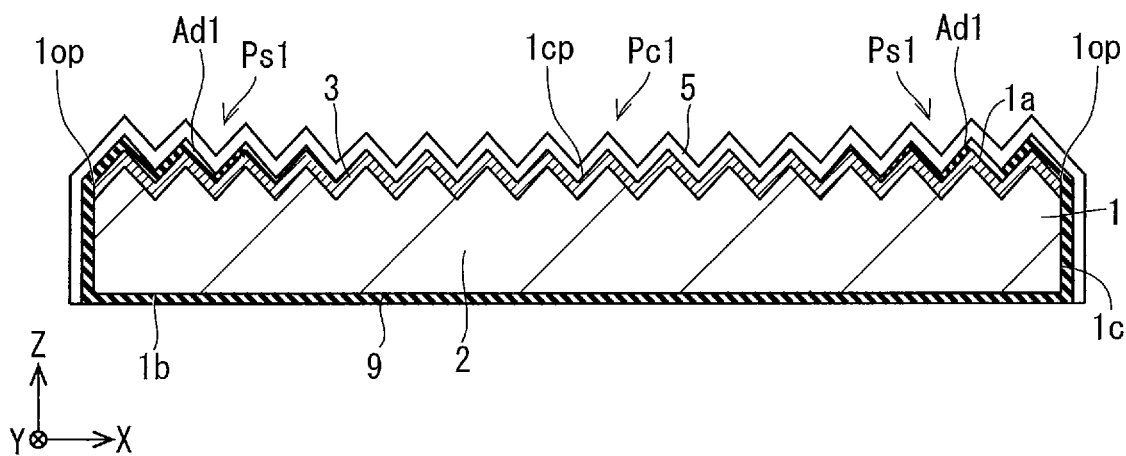
FIG. 8 illustrates a drawing showing an example of the state in the middle of manufacturing in the portion corresponding to the virtual cut section of FIG. 3 in the solar battery device according to the first embodiment.

Next, as shown in FIG. 8, the passivation layer 9 is formed on the surface of the semiconductor substrate 1. Most of the passivation layer 9 is made of aluminum oxide, for example. Further, as shown in FIG. 8, the antireflection layer 5 is formed on the semiconductor substrate 1 with the passivation layer 9 formed on the surface. Most of the antireflection layer 5 is made of a silicon nitride, for example. When, for example, ALD or thermal CVD is used as a method for forming the passivation layer 9, the passivation layer 9 can be easily formed on the first surface 1a side, the second surface 1b side, and the third surface 1c side of the semiconductor substrate 1.

Figure 11:
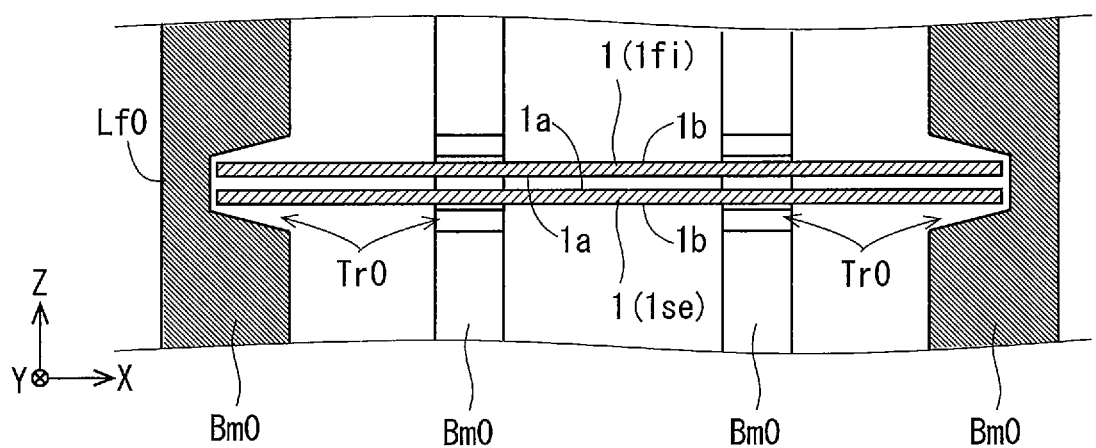
FIG. 11 illustrates a view showing an example of a state where a passivation layer is formed in a step of manufacturing the solar battery device according to the first embodiment.

For example, at the time of forming the passivation layer 9 by ALD, the semiconductor substrate 1 in which the first semiconductor region 3 has been formed is first placed in a chamber of a film forming apparatus. At this time, for example, as shown in FIG. 11, the plurality of semiconductor substrates 1 are placed in the chamber while being supported by a cassette Lf0. Here, for example, two semiconductor substrates 1 are disposed in a groove Tr0 capable of supporting one semiconductor substrate 1 on the cassette Lf0. Specifically, for example, the first semiconductor substrate 1fi and the second semiconductor substrate 1se are disposed in the chamber such that the first surface 1a of the first semiconductor substrate 1fi and the first surface 1a of the second semiconductor substrate 1se are close to and face each other. Here, for example, in the chamber, the cassette Lf0 is disposed such that the +Y direction is upward. As the cassette Lf0, for example, a configuration is adopted in which a plurality of rod-shaped portions (also referred to as rod-shaped parts) Bm0 are provided, and a plurality of sets of grooves Tr0 are present in the plurality of rod-shaped parts Bm0.

Then, in a state where the first semiconductor substrate 1fi and the second semiconductor substrate 1se are disposed in the chamber as described above, a passivation layer 9 is formed on the surface of each of the plurality of semiconductor substrates 1 including the first semiconductor substrate 1fi and the second semiconductor substrate 1se. Here, the following steps A to D are repeated a plurality of times, while the semiconductor substrate 1 is heated to a temperature range of approximately 100° C. to 250° C., to form the passivation layer 9 containing aluminum oxide. At this time, since the first surface 1a of the first semiconductor substrate 1fi and the first surface 1a of the second semiconductor substrate 1se are located close to each other, as a position is farther from the outer peripheral portion 1op on the first surface 1a of each semiconductor substrate 1, the material of the passivation layer 9 is less likely to be supplied. Thus, as shown in FIG. 8, the passivation layer 9 is formed so as to include the variable thickness region Ad1 in a state where the thickness decreases from the outer peripheral portion 1op side toward the central part 1cp side on the first surface 1a of each of the first semiconductor substrate 1fi and the second semiconductor substrate 1se. Here, for example, as compared with a case where the passivation layer 9 is formed in a state where the first surface 1a side of the semiconductor substrate 1 is covered with a mask, the step of forming the mask and the step of removing the mask becomes unnecessary. Thereby, for example, the productivity can be improved. Further, for example, as compared with a case where the passivation layer 9 is formed on the entire surface of the semiconductor substrate 1 while the mask is not formed on the semiconductor substrate 1, the step of removing the passivation layer 9 formed on the first surface 1a side of the semiconductor substrate 1 becomes unnecessary. Thereby, for example, the productivity can be improved.

As described above, in the semiconductor substrate 1, for example, the density of crystal defects generated at the time of preparing a semiconductor ingot by casting and at the time of cutting the semiconductor ingot increases toward the outer peripheral portion 1op. Therefore, in the solar battery device 10 according to the first embodiment, for example, on the first surface 1a side of the semiconductor substrate 1, the passivation layer 9 is present in a state where the thickness increases toward the outer peripheral portion side of the first surface 1a in accordance with the density of crystal defects. Here, by forming the passivation layer 9 in the state as shown in FIG. 11, for example, the passivation layer 9 having a desired thickness change can be formed easily. Therefore, it is possible to easily improve the photoelectric conversion efficiency in the solar battery device 10, for example.

Here, for example, even when the second passivation layer containing silicon oxide, which is different from the first passivation layer 9, is formed between the second semiconductor region 2 and the first passivation layer 9 containing aluminum oxide, the second passivation layer can be formed by ALD. In this case, the second passivation layer containing silicon oxide can be formed by repeating the following steps A to D a plurality of times while the semiconductor substrate 1 is heated to a temperature range similar to the temperature range described above. Details of the steps A to D are as follows:

[Step A] A silicon material, such as bisdiethylaminosilane (BDEAS), for formation of a silicon oxide layer or an aluminum material, such as trimethylaluminum (TMA), for formation of aluminum oxide is supplied onto the semiconductor substrate 1 along with a carrier gas. To the carrier gas, for example, an Ar gas, a nitrogen gas or the like is applied. At this time, the silicon material or the aluminum material is adsorbed to the first surface 1a, the second surface 1b, and the third surface 1c of the semiconductor substrate 1. The time during which the BDEAS or the TMA is supplied may only be approximately 15 msec to 3,000 msec, for example. Here, at the start of the step A, the surface of the semiconductor substrate 1 may be terminated with an —OH group. In other words, the structure of the surface of the semiconductor substrate 1 may include a Si—O—H bond. This structure can be formed, for example, by treating the semiconductor substrate 1 with dilute hydrofluoric acid and then washing the treated substrate with pure water.

[Step B] The chamber of the film forming apparatus is purified with a nitrogen gas to remove the silicon material or the aluminum material in the chamber. Furthermore, from the silicon material or the aluminum material physically absorbed and chemically absorbed to the semiconductor substrate 1, a silicon material or an aluminum material except for a component chemically absorbed at an atomic layer level is removed. The time during which the chamber is purified with the nitrogen gas may only be approximately one second to dozens of seconds, for example.

[Step C] An oxidizer such as water or an ozone gas is supplied into the chamber of the film forming apparatus, so that the alkyl group contained in BDEAS or TMA is removed and substituted with the OH group. An atomic layer of the silicon oxide or the aluminum oxide is thereby formed on the semiconductor substrate 1. Here, the time during which the oxidizer is supplied into the chamber may only be approximately 750 msec to 1,100 msec, for example. Further, for example, by supplying hydrogen (H) along with the oxidizer into the chamber, many hydrogen atoms are easily contained in the silicon oxide or the aluminum oxide.

[Step D] By purifying the inside of the chamber of the film forming apparatus with nitrogen gas, the oxidizer in the chamber is removed. At this time, for example, an oxidizer not having contributed to a reaction during the formation of the silicon oxide or the aluminum oxide at the atomic layer level on the semiconductor substrate 1 is removed. The time during which the chamber is purified with the nitrogen gas may only be approximately one second to dozens of seconds, for example.

A series of the steps A to D is thereafter repeated a plurality of times so that the silicon oxide layer or the aluminum oxide layer having a desired thickness can be formed.

Then, the antireflection layer 5 is formed on the first surface 1a side and the third surface 1c side of the semiconductor substrate 1. Here, the antireflection layer 5 can be formed by using plasma CVD (plasma-enhanced chemical vapor deposition (PECVD)) or sputtering. When PECVD is applied, the semiconductor substrate 1 is heated in advance at a temperature higher than a temperature at which the antireflection layer 5 is formed, for example. Then, a mixed gas of silane ($SiH_4$) and ammonia ($NH_3$) is diluted with nitrogen ($N_2$), is made into plasma by glow discharge decomposition at a reaction pressure of 50 Pa to 200 Pa, and is deposited on the heated semiconductor substrate 1 to form the antireflection layer 5. Here, the antireflection layer 5 is formed at a temperature of approximately 350° C. to 650° C., and the preheating temperature is set higher than the layer forming temperature by approximately 50° C. Moreover, a frequency of a high-frequency power supply required for glow discharge is set to 10 kHz to 500 kHz. In addition, the flow rate of the gas is appropriately determined in accordance with the size of the reaction chamber and the like. The flow rate of the gas is, for example, in the range of 150 ml/min (sccm) to 6000 ml/min (sccm). A flow ratio (B/A) of the flow rate B of the ammonia to a flow rate A of the silane is, for example, 0.5 to 15.

Figure 9:
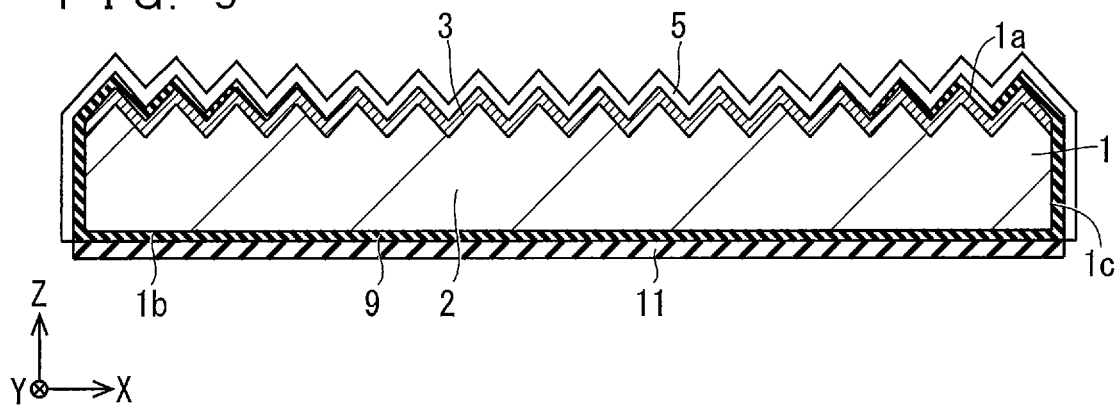
FIG. 9 illustrates a drawing showing an example of the state in the middle of manufacturing in the portion corresponding to the virtual cut section of FIG. 3 in the solar battery device according to the first embodiment.

Next, as shown in FIG. 9, the protective layer 11 is formed on at least a part of the passivation layer 9 on the second surface 1b side of the semiconductor substrate 1. Here, for example, by forming a silicon nitride layer using CVD or sputtering, the protective layer 11 can be formed on the passivation layer 9.

Next, the passivation layer 9 and the protective layer 11 are partially removed by laser beam irradiation to form a hole. Such a hole is formed, for example, by laser beam irradiation using an yttrium aluminum garnet (YAG) laser.

Figure 10:
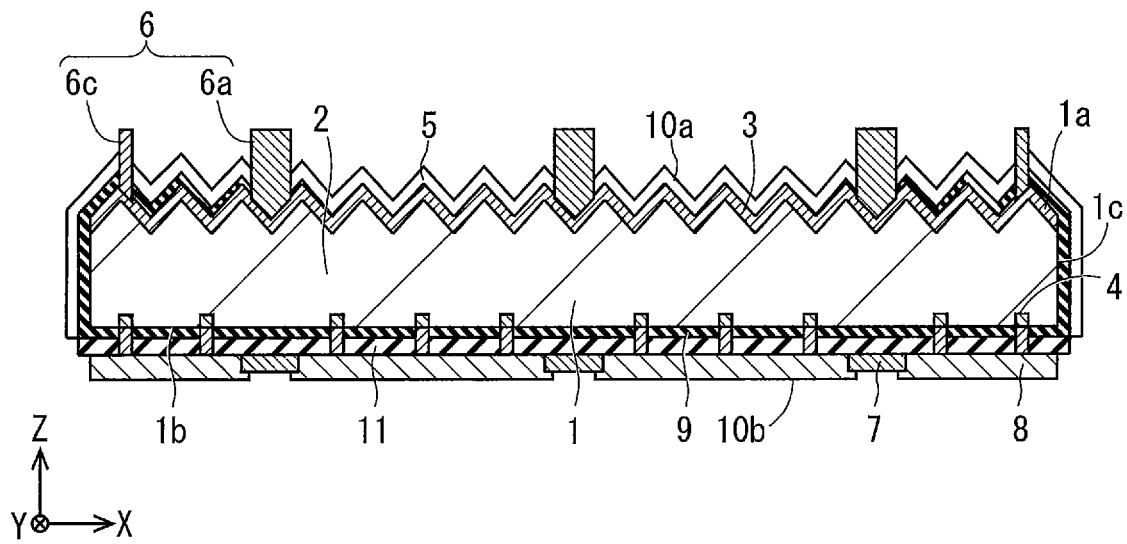
FIG. 10 illustrates a drawing showing an example of the state in the middle of manufacturing in the portion corresponding to the virtual cut section of FIG. 3 in the solar battery device according to the first embodiment.

Next, as shown in FIG. 10, for example, the first electrode 6, the second electrode 7, and the third electrode 8 are formed as described below.

The first electrode 6 can be prepared using a metal paste (also referred to as a first metal paste) that includes a metal powder containing silver as a main component, an organic vehicle, a glass frit and the like, for example. Here, for example, first, the first metal paste is applied to a portion on the first surface 1a side of the semiconductor substrate 1 by screen printing or the like. The first metal paste after this application may be subjected to drying in which a solvent is evaporated at a predetermined temperature. The first metal paste is then fired in a firing oven under conditions of, for example, the maximum temperature of 600° C. to 850° C. and the heating time of approximately dozens of seconds to dozens of minutes to form the first electrode 6. Here, for example, when the screen printing is used, the output extracting electrode 6a and the collecting electrode 6b can be formed in one step.

The second electrode 7 can be prepared using a metal paste (also referred to as a second metal paste) that includes a metal powder containing silver as a main component, an organic vehicle, a glass frit and the like, for example. Here, for example, first, the second metal paste is applied to a portion on the second surface 1b side of the semiconductor substrate 1 by screen printing or the like. The second metal paste after this application may be subjected to drying in which a solvent is evaporated at a predetermined temperature. The second metal paste is then fired in the firing oven under conditions of, for example, the maximum temperature of 600° C. to 850° C. and the heating time of approximately dozens of seconds to dozens of minutes to form the second electrode 7 on the second surface 1b side of the semiconductor substrate 1.

The third electrode 8 can be prepared using, for example, a metal paste (also referred to as a third metal paste) that includes a metal powder containing aluminum as a main component, an organic vehicle, and a glass frit. Here, for example, first, the third metal paste is applied to a portion on the second surface 1b side of the semiconductor substrate 1 by screen printing or the like so as to come into contact with a part of the second metal paste applied in advance. At this time, the third metal paste may be applied to almost the entire surface of the portion on the second surface 1b side of the semiconductor substrate 1 except for a part of the portion at which the second electrode 7 is formed. The application of the third metal paste can be achieved by, for example, screen printing or the like. The third metal paste after this application may be subjected to drying in which the solvent is evaporated at a predetermined temperature. The third metal paste is then fired in the firing oven under conditions of, for example, the maximum temperature of 600° C. to 850° C. and the heating time of approximately dozens of seconds to dozens of minutes to form the third electrode 8 on the second surface 1b side of the semiconductor substrate 1. At the time of this firing, the third metal paste is connected to the second semiconductor region 2 through the hole and forms the third electrode 8 on a part of the second surface 1b of the semiconductor substrate 1. Further, along with the formation of the third electrode 8, the third semiconductor region 4 is also formed. On the other hand, the third metal paste on the protective layer 11 is blocked by the protective layer 11. Therefore, the passivation layer 9 is hardly adversely affected during the firing of the third metal paste.

The solar battery device 10 can be prepared in the above-mentioned steps. The second electrode 7 may be formed after formation of the third electrode 8, for example. Moreover, the second electrode 7 need not be in direct contact with the semiconductor substrate 1, for example. The second electrode 7 may be located on the protective layer 11, for example. In addition, the first electrode 6, the second electrode 7, and the third electrode 8 may be formed by applying the respective metal pastes and then simultaneously firing these metal pastes. Thereby, for example, the productivity of the solar battery device 10 is improved, and the output characteristics of the solar battery device 10 can also be improved by reduction in the history of heat applied to the semiconductor substrate 1.

1-3. Example

Next, an example of the solar battery device 10 according to the first embodiment will be described. The example of the solar battery device 10 according to the first embodiment was prepared as follows.

First, as the semiconductor substrate 1 having the p-type second semiconductor region 2, a polycrystalline silicon substrate having square front and back surfaces each with a one-side length of about 156 mm and a thickness of about 200 μm was prepared. The semiconductor substrate 1 was etched with a NaOH aqueous solution to remove a damaged layer on the surface. Thereafter, the semiconductor substrate 1 was cleaned. The texture was formed on the first surface 1a side of the semiconductor substrate 1 by using RIE.

Next, phosphorus was introduced by diffusion into the surface layer part on the first surface 1a side of the semiconductor substrate 1 by gas phase thermal diffusion using phosphorus oxychloride as a diffusion source. Thereby, the n-type first semiconductor region 3 having a sheet-resistance of approximately 90Ω/□ was formed. At this time, the first semiconductor region 3 formed on the third surface 1c side and the second surface 1b side of the semiconductor substrate 1 was removed by a hydrofluoric-nitric acid solution. Thereafter, phosphorus glass remaining on the first surface 1a side of the semiconductor substrate 1 was removed by a hydrofluoric acid solution.

Next, an aluminum oxide layer was formed as the passivation layer 9 on the surface of the semiconductor substrate 1 by using ALD. At this time, the formation of the aluminum oxide layer by using ALD was performed under the following conditions. The first semiconductor substrate 1fi and the second semiconductor substrate 1se were disposed such that the first surface 1a of the first semiconductor substrate 1fi and the first surface 1a of the second semiconductor substrate 1se are close to and face each other in the chamber of the film forming apparatus. In this state, the surface temperature of each semiconductor substrate 1 was maintained so as to be approximately 200° C. Then, using TMA as an aluminum material and ozone gas as an oxidizer, the passivation layer 9 containing aluminum oxide as a main component was formed so as to have a thickness of about 30 nm on the second surface 1b side.

Next, on the first surface 1a side, the antireflection layer 5 having a thickness of about 70 nm and containing silicon nitride as a main component was formed by PECVD.

Next, a film of silicon nitride was formed on the passivation layer 9 formed on the second surface 1b side by PECVD to form the protective layer 11 having a thickness of about 200 nm.

Then, the first metal paste was applied to the first surface 1a side so as to have a pattern of the first electrode 6, the second metal paste was applied on the second surface 1b side so as to have a pattern of the second electrode 7. Further, the third metal paste was applied to the second surface 1b side so as to have a pattern of the third electrode 8. Thereafter, the third semiconductor region 4, the first electrode 6, the second electrode 7, and the third electrode 8 were formed by firing these metal pastes under conditions that the maximum temperature is 710° C. and the firing time is 10 minutes. Thus, the example of the solar battery device 10 was prepared.

On the other hand, based on the method for manufacturing the example of the solar battery device 10, in the step of forming the passivation layer 9, the first surface 1a was covered with a mask to prepare a reference example of the solar battery device 10 without forming the passivation layer 9 on the first surface 1a.

<1-3-1. Solar Battery EL Inspection>

Terminals were respectively attached to the output extracting electrode 6a on the first device surface 10a side and the second electrode 7 on the second device surface 10b side for each of the example and the reference example of the solar battery device 10 manufactured as described above. Further, the imaging device was disposed such that the first device surface 10a of each of the example and the reference example of the solar battery device 10 was an object. For each of the example and the reference example of the solar battery device 10, while a fixed electric current is allowed to flow between the output extracting electrode 6a and the second electrode 7, an inspection (also referred to as solar battery EL inspection) was performed in which the state of light emission (electro luminescence: EL) on the first device surface 10a is captured by the imaging device. At this time, a solar battery EL inspection apparatus (PVX 100 manufactured by ITES Co., Ltd.) was used.

Figure 12A:
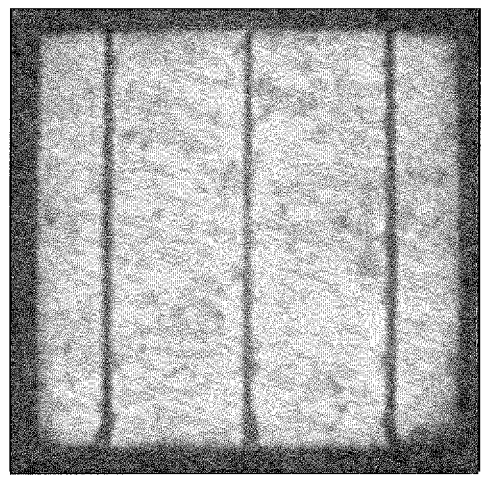
FIG. 12A illustrates a view showing an example of an image of a light emission state captured in an example of the solar battery device in a solar battery EL inspection.
Figure 12B:
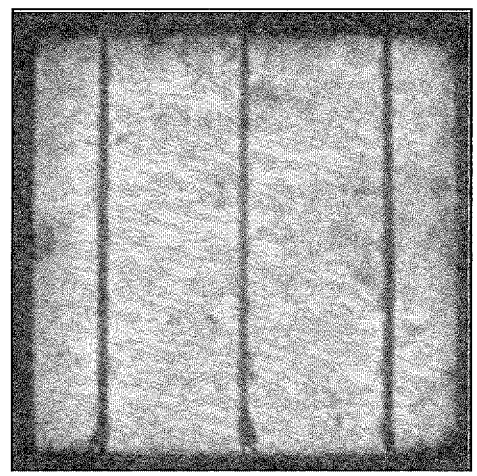
FIG. 12B illustrates a view showing an example of an image of a light emission state captured in a reference example of the solar battery device in the solar battery EL inspection.

As shown in FIG. 12B, in the reference example of the solar battery device 10, the light emission amount decreased in the outer peripheral portion 1op of the first device surface 10a and in the vicinity thereof. In contrast, as shown in FIG. 12A, in the example of the solar battery device 10, as compared with the reference example of the solar battery device 10, the decrease in light emission was reduced in the outer peripheral portion 1op of the first device surface 10a and in the vicinity thereof. Thereby, in the example of the semiconductor substrate 1, it was presumed that the inactivation of crystal defects due to the termination of dangling bonds or the like is achieved by the presence of the passivation layer 9 including the variable thickness region Ad1 in a state where the thickness increases toward the outer peripheral portion 1op side on the first surface 1a side.

<1-3-2. Reflection Characteristics of First Surface of Solar Battery Device>

In the example of the solar battery device 10 prepared as described above, a reflectance was measured at a position about 15 mm from the outer peripheral portion on the first device surface 10a (also referred to as a first measurement position) and at a position about 70 mm from the outer peripheral portion on the first device surface 10a (also referred to as a second measurement position). Here, for a wavelength range of 300 nm to 1200 nm, the first device surface 10a was sequentially irradiated with light at every 10-nm wavelength, and the light reflected from the first device surface 10a at that time was collected by an integrating sphere, to measure the intensity of the reflected light by using a diode. That is, the first device surface 10a was irradiated with light at a wavelength of 300 nm to measure the intensity of the reflected light, the first device surface 10a was irradiated with light at a wavelength of 310 nm to measure the intensity of the reflected light, . . . , and the first device surface 10a was irradiated with light at a wavelength of 1200 nm to measure the intensity of the reflected light. At this time, a 10 mm square region on the first device surface 10a was irradiated with the light at each wavelength. Then, for the light at each wavelength, an intensity (also referred to as first intensity) I1 of the reflected light on the first device surface 10a was divided by an intensity (also referred to as second intensity) I2 of the incident light with which the first device surface 10a had been irradiated, to calculate a reflectance R (=(I1/I2)×100) [%].

Figure 13:
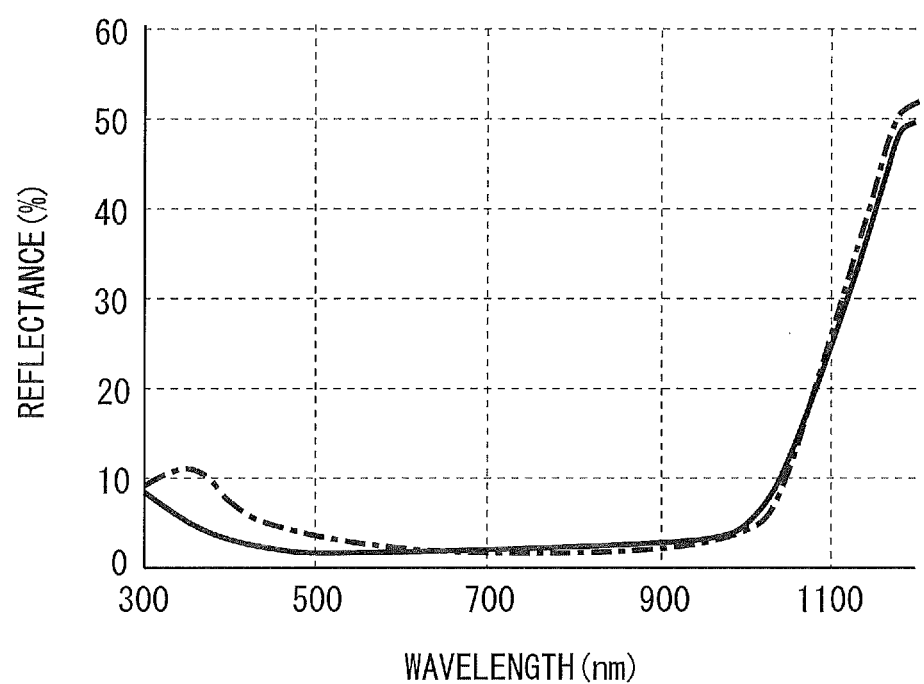
FIG. 13 illustrates a graph showing an example of a spectral reflectance on the front of the example.

In FIG. 13, the relationship between the wavelength of light and the reflectance (also referred to as a spectral reflectance) at the first measurement position is drawn by a thick dashed-dotted line, and the relationship between the wavelength of light and the reflectance (spectral reflectance) at the second measurement position is drawn by a thick solid line. As shown in FIG. 13, at the first measurement position, the reflectance for the wavelength range from blue light to ultraviolet light, which is of 300 nm to 500 nm, was large as compared with that at the second measurement position.

Thereby, in the example of the solar battery device 10, it was presumed that the reflectance for the wavelength range from the blue light to the ultraviolet light decreases from the outer peripheral portion 1op side toward the central part 1cp side on the first surfaces 1a. Therefore, it is found that, for example, on the first device surface 10a, even when the reflectance increases to some extent due to the presence of the passivation layer 9 on the outer peripheral portion 1op side, the reflectance decreases on the central part 1cp side and its periphery. In other words, in the example of the solar battery device 10, it was presumed that the light with which the first surface 1a side of the semiconductor substrate 1 is irradiated is easily absorbed by the semiconductor substrate 1, and the photoelectric conversion efficiency is improved.

1-4. Summary of First Embodiment

In the solar battery device 10 according to the first embodiment, for example, the covering part Pc1 is present on the first surface 1a side of the semiconductor substrate 1. The covering part Pc1 includes the laminated portion Ps1 in which a plurality of layers including the passivation layer 9 and the antireflection film 5 are present in a laminated state. In the laminated portion Ps1, the passivation layer 9 includes the variable thickness region Ad1 in which the thickness decreases from the outer peripheral portion 1op side toward the central part 1cp side on the first surface 1a. In other words, on the first surface 1a side of the semiconductor substrate 1, the passivation layer 9 is located such that the thickness increases in accordance with the density of the crystal defects toward the outer peripheral portion 1op side of the first surface 1a. In this case, for example, on the surface of the semiconductor substrate 1, the inactivation of crystal defects is achieved by termination of dangling bonds or the like due to the presence of the passivation layer 9. Thereby, the recombination of minority carrier can be reduced on the first surface 1a side of the semiconductor substrate 1, for example. Then, the variable thickness region Ad1 can be easily formed, for example, by the method for manufacturing the solar battery device 10 described above. Hence it is possible to easily improve the photoelectric conversion efficiency in the solar battery device 10.

Further, for example, when the passivation layer 9 includes a portion located on the second surface 1b side of the semiconductor substrate 1, on the second surface 1b side of the semiconductor substrate 1, the inactivation of crystal defects due to the termination of dangling bonds or the like makes the recombination of minority carrier less likely to occur. It is thus possible to easily improve the photoelectric conversion efficiency in the solar battery device 10, for example. Moreover, for example, when the surface layer part on the second surface 1b side of the semiconductor substrate 1 is a p-type semiconductor region, the recombination of minority carrier hardly occurs due to the electric field passivation effect produced by the passivation layer 9 on the second surface 1b side of the semiconductor substrate 1. Therefore, the inactivation of crystal defects due to the termination of dangling bonds is performed by the passivation layer 9 on both the first surface 1a side and the second surface 1b side of the semiconductor substrate 1. Therefore, on the second surface 1b side of the semiconductor substrate 1, the electric field passivation effect can be obtained by the passivation layer 9. As a result, for example, the photoelectric conversion efficiency in the solar battery device 10 can be improved.

2. Other Embodiments

The present disclosure is not limited to the first embodiment described above, and various changes, improvements, and the like are possible without departing from the gist of the present disclosure.

2-1. Second Embodiment

Figure 14:
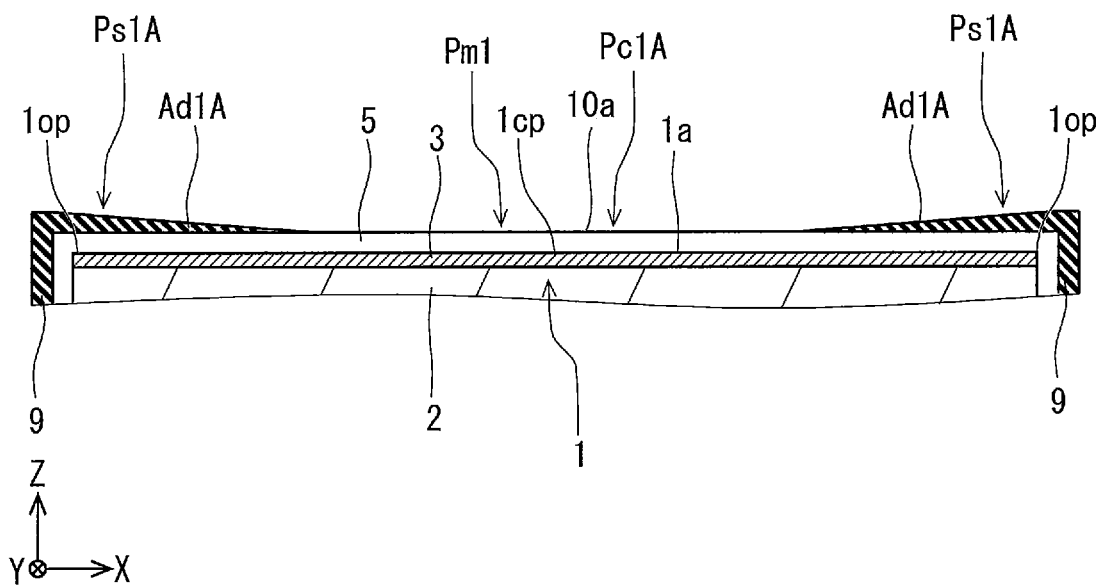
FIG. 14 illustrates a drawing schematically showing a virtual cut section in a portion on a first surface side corresponding to a virtual cut section of FIG. 3 in a solar battery device according to a second embodiment.

In the first embodiment, for example, as shown in FIG. 14, the antireflection layer 5 may be located on the first surface 1a of the semiconductor substrate 1, and the passivation layer 9 may be located on the antireflection layer 5. Specifically, for example, with the covering part Pc1 of the first embodiment as a basic configuration, a covering part Pc1A located on the first surface 1a side of the semiconductor substrate 1 may be formed by changing the positions of the passivation layer 9 and the antireflection layer 5 upside down.

In the example of FIG. 14, the covering part Pc1A includes the antireflection layer 5 located on the first surface 1a of the semiconductor substrate 1 and the passivation layer 9 located on the antireflection layer 5. Specifically, the covering part Pc1A includes a portion (laminated portion) Ps1A in which a plurality of layers including the passivation layer 9 and the antireflection film 5 are present in a laminated state. In the laminated portion Ps1A, the antireflection layer 5 is located in contact with the first surface 1a. In other words, in the solar battery device 10, the first surface 1a of the semiconductor substrate 1 is located in the state of being directly covered with the antireflection layer 5. Furthermore, the antireflection layer 5 is located in the state of being covered with the passivation layer 9. The passivation layer 9 includes a variable thickness region Ad1A in which the thickness decreases from the outer peripheral portion 1op side toward the central part 1cp side of the first surface 1a.

When the above configuration is adopted, for example, the antireflection layer 5 having a positive fixed charge is located on the n-type first semiconductor region 3, and a positive fixed charge can be introduced to the interface between the antireflection layer 5 and the semiconductor substrate 1. Thereby, for example, in the vicinity of the interface between the antireflection layer 5 and the semiconductor substrate 1, the recombination of minority carrier is reduced due to the electric field passivation effect.

When a solar battery module using the solar battery device 10 is used for large scale solar power generation, for example, a large voltage difference of approximately 600 V to 1000 V may occur between a light transmissive substrate such as glass of the solar battery module and the solar battery device 10. In contrast, when the passivation layer 9 having a negative fixed charge is present between the positively charged light transmissive substrate and the antireflection layer 5 having a positive fixed charge, the large voltage difference described above hardly affects the antireflection layer 5. For this reason, the negative fixed charge is hardly accumulated in the antireflection layer 5. Thereby, at the interface between the antireflection layer 5 and the first semiconductor region 3, the movement of photo-producing carriers is not significantly impeded by the antireflection layer 5, and the generation of a phenomenon causing degradation of output (potential induced degradation (PID)) can be reduced. In other words, the resistance to PID (also referred to as PID resistance) can be improved.

Further, for example, in the laminated portion Ps1A in which the antireflection layer 5 is covered with the passivation layer 9, at the time of performing thermal treatment such as firing for forming the first electrode 6, the second electrode 7, and the third electrode 8, hydrogen in the antireflection layer 5 hardly escapes to the external space. Therefore, the hydrogen in the antireflection layer 5 is easily diffused to the first surface 1a side of the semiconductor substrate 1. In other words, the passivation layer 9 functions as a cap layer of the antireflection layer 5. Thereby, for example, on the first surface 1a side of the semiconductor substrate 1, the dangling bonds in the outer peripheral portion 1op and the vicinity thereof are easily terminated by the hydrogen supplied from the antireflection layer 5. As a result, the recombination of minority carrier hardly occurs on the first surface 1a side of the semiconductor substrate 1. Furthermore, here, the larger the thickness of the passivation layer 9, the more the function of the passivation layer 9 as the cap layer of the antireflection layer 5 can be enhanced. Therefore, for example, on the first surface 1a side of the semiconductor substrate 1, the thickness of the passivation layer 9 increases corresponding to the density of crystal defects toward the outer peripheral portion 1op side of the first surface 1a, and the function of the passivation layer 9 as the cap layer of the antireflection layer 5 can be enhanced. Thereby, for example, the photoelectric conversion efficiency in the solar battery device 10 can be improved. Moreover, for example, when the passivation layer 9 is formed by ALD or the like, the density of hydrogen contained in the passivation layer 9 can be high. In this case, for example, when the density of the hydrogen in the passivation layer 9 is higher than the density of hydrogen in the antireflection layer 5, the function of the passivation layer 9 as the cap layer of the antireflection layer 5 can be enhanced.

2-2. Third Embodiment

Figure 15:
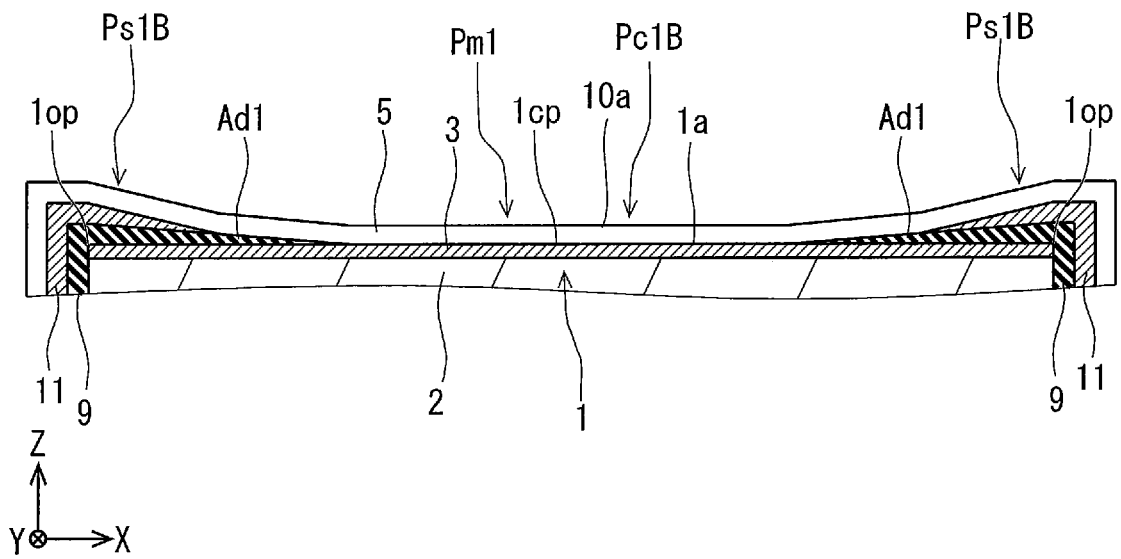
FIG. 15 illustrates a drawing schematically showing a virtual cut section in a portion on a first surface side corresponding to a virtual cut section of FIG. 3 in a solar battery device according to a third embodiment.

In each of the above embodiments, for example, as shown in FIG. 15, the protective layer 11 may be located also on the first surface 1a side of the semiconductor substrate 1. Specifically, for example, with the covering part Pc1 of the first embodiment as a basic configuration, a covering part Pc1B located on the first surface 1a side of the semiconductor substrate 1 may be formed by a change made so that the protective layer 11 is located between the passivation layer 9 and the antireflection layer 5. In the example of FIG. 15, the covering part Pc1B includes the passivation layer 9 located on the first surface 1a of the semiconductor substrate 1, the protective layer 11 located on the passivation layer 9, and the antireflection layer 5 located on the protective layer 11. The protective layer 11 can be formed, for example, as follows.

As shown in FIG. 11, in the chamber, the first semiconductor substrate 1fi and the second semiconductor substrate 1se are disposed such that the first surface 1a of the first semiconductor substrate 1fi and the first surface 1a of the second semiconductor substrate 1se are close to and face each other in the chamber. Then, in a state where the first semiconductor substrate 1fi and the second semiconductor substrate 1se are disposed in the chamber as described above, the protective layer 11 is formed by CVD or the like on the surface of each of the plurality of semiconductor substrates 1 including the first semiconductor substrate 1fi and the second semiconductor substrate 1se.

2-3. Fourth Embodiment

Figure 16:
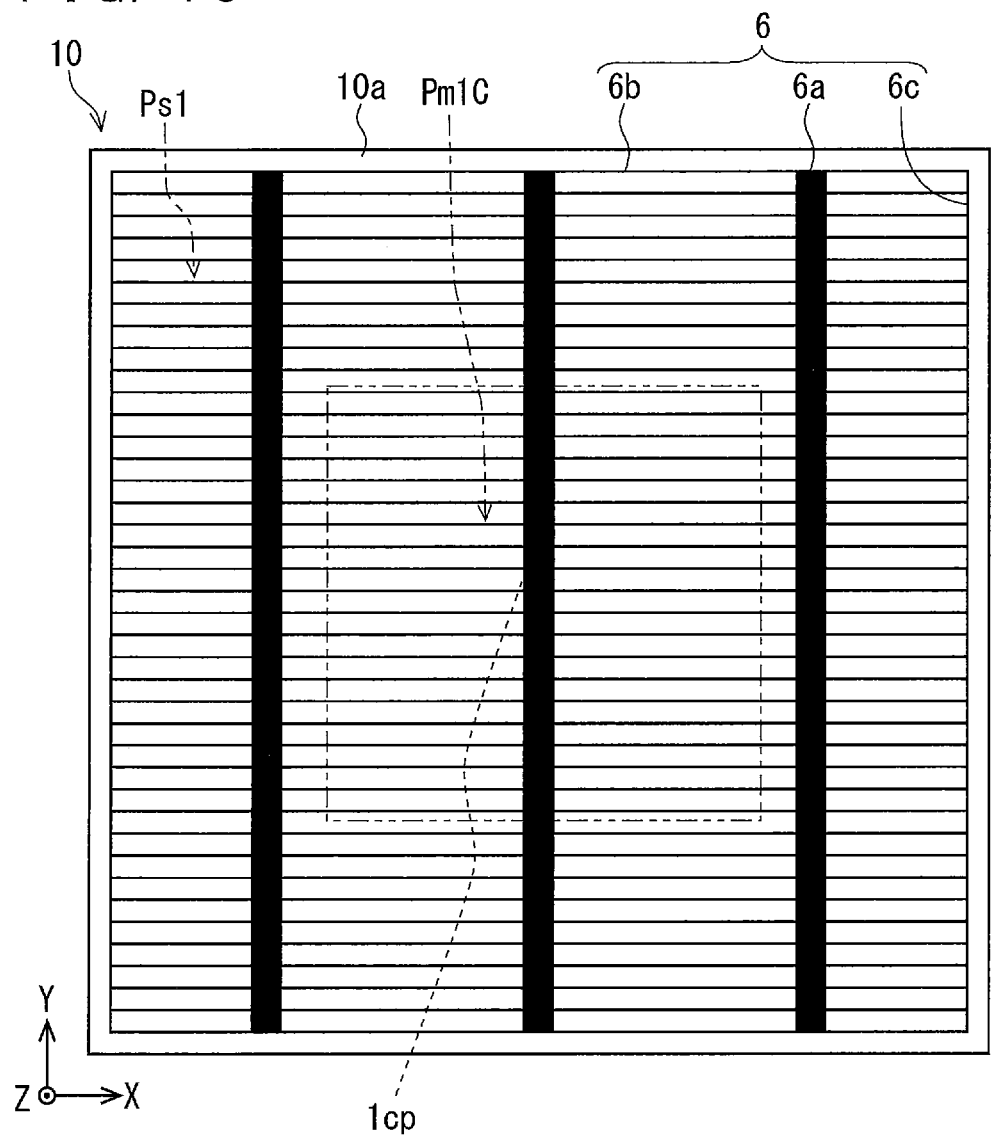
FIG. 16 illustrates a plan view showing an appearance of a light-receiving surface side in an example of a solar battery device according to a fourth embodiment.
Figure 17:
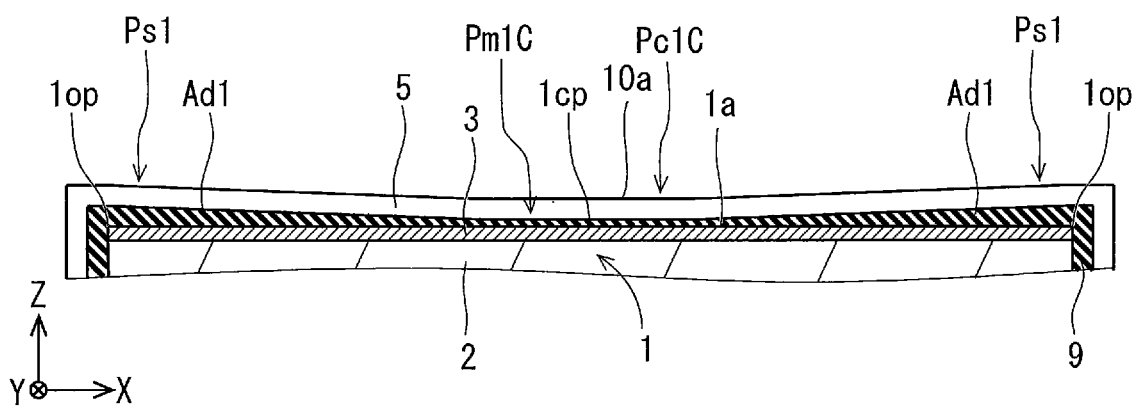
FIG. 17 illustrates a drawing schematically showing a virtual cut section in a portion on a first surface side corresponding to a virtual cut section of FIG. 3 in the solar battery device according to the fourth embodiment.

In each of the above embodiments, for example, as shown in FIGS. 16 and 17, the passivation layer 9 may be present also in the central part 1cp of the first surface 1a and its periphery. Specifically, for example, with the covering part Pc1 of the first embodiment as a basic configuration, a covering part Pc1C located on the first surface 1a side of the semiconductor substrate 1 may be formed by a change made so that the passivation layer 9 is also present in the central part 1cp of the first surface 1a and its periphery. In the example of FIGS. 16 and 17, when the first surface 1a of the semiconductor substrate 1 is seen in perspective plan view, in the covering part Pc1C, the passivation layer 9 includes a region (also referred to as a presence region) Pm1C located on the central part 1cp of the first surface 1a. In this case, the thickness of the passivation layer 9 in the presence region Pm1C is changed according to the material of the passivation layer 9 and the size of the fixed charge density, but is, for example, 5 nm or less. In this case, for example, in the surface layer part of the central part 1cp on the first surface 1a side of the semiconductor substrate 1, the inactivation of crystal defects due to the termination of dangling bonds or the like makes the recombination of minority carrier less likely to occur. On the other hand, for example, even if the passivation layer 9 has a negative fixed charge, when the thickness of the passivation layer 9 is 5 nm or less, the recombination of minority carrier hardly increases. Therefore, for example, the photoelectric conversion efficiency in the solar battery device 10 can be improved. Further, in FIG. 17, the passivation layer 9 present in the central part 1cp of the first surface 1a and its periphery has a constant film thickness, but the passivation layer 9 in the central part 1cp may also be located such that the film thickness increases toward the outer peripheral portion 1op side.

3. Others

In each of the above embodiments, for example, on the first surface 1a side of the semiconductor substrate 1, a layer of silica may further be located on the passivation layer 9 containing aluminum oxide as a main component. In this case, for example, by adding the layer of silica to the laminated portion Ps1, the reflectance in the region on the outer peripheral portion 1op side of the first device surface 10a can be reduced.

In each of the above embodiments, for example, the solar battery device 10 may not be a PERC type solar battery device but may be a back-contact type solar battery device having a structure such as interdigitated back contact (IBC), metal wrap through (MWT), or emitter wrap through (EWT). Specifically, the solar battery device 10 may, for example, have a structure in which the laminated portions Ps1, Ps1A, and Ps1B including at least a part of the passivation layer 9 and the antireflection layer 5 are located on the first surface 1a of the semiconductor substrate 1.

In each of the above embodiments, for example, on the first surface 1a side of the semiconductor substrate 1, a region where the thickness of the passivation layer 9 is constant may be present in the vicinity of the outer peripheral portion 1op. In this case, for example, the passivation layer 9 may include a region with a constant thickness and a variable thickness region Ad1 located on the central part 1cp side of this region.

In each of the above embodiments, for example, a case is considered where the first silica layer, the alumina passivation layer 9, and the second silica layer are sequentially formed in that order on the second surface 1b of the semiconductor substrate 1 by ALD. Here, the thickness of the first silica layer is, for example, approximately 0.6 nm, the thickness of the passivation layer 9 is, for example, approximately 15 nm, and the thickness of the second silica layer is, for example, approximately 5 nm. In this case, for example, the first silica layer, the alumina passivation layer 9, and the second silica layer may also be formed in that order in the vicinity of the outer peripheral portion 1op on the first surface 1a side of the semiconductor substrate 1.

In each of the above embodiments, for example, the protective layer 11 made of silicon nitride is formed by PECVD, but the protective layer 11 may be formed using an insulating paste. In this case, first, an insulating paste containing a siloxane resin (an organic compound having a siloxane bond (Si—O—Si bond)) as a main component is applied onto the passivation layer 9. Then, by drying the insulating paste, the protective layer 11 can be formed on the passivation layer 9. Specifically, for example, the insulating paste is applied to at least a part of the top of the passivation layer 9 by using screen printing or the like so as to have a desired pattern. The insulating paste is then dried under conditions of the maximum temperature of 150° C. to 350° C. and a heating time of one minute to ten minutes by using a hot plate, a drying oven, or the like. Thereby, the protective layer 11 having the desired pattern can be formed on the passivation layer 9.

Then, at the time of firing the third metal paste, the third metal paste is fired through the passivation layer 9 via the hole of the protective layer 11. At this time, the third metal paste is connected to the second semiconductor region 2 and forms the third electrode 8 on the second surface 1b side of the semiconductor substrate 1. Further, associated with the formation of the third electrode 8, the third semiconductor region 4 is also formed in the surface layer part on the second surface 1b side of the semiconductor substrate 1. Thereby, the step of partially removing the passivation layer 9 and the protective layer 11 by laser beam irradiation to form a hole becomes unnecessary. Therefore, the productivity of the solar battery device is improved.

It goes without saying that all or a part of each of the embodiments and each of modified examples can be combined as appropriate in a non-contradictory range.

The invention claimed is:
1. A solar battery device comprising:
 a semiconductor substrate, the semiconductor substrate having a first-conductivity-type first semiconductor region located on a first surface and a second-conductivity-type second semiconductor region different from the first-conductivity-type and located on a second surface opposite from the first surface; and
 a covering part located on the first surface of the semiconductor substrate, the covering part having a laminated portion in which a plurality of layers including a passivation layer and an antireflection layer are present in a laminated state,
 wherein in the laminated portion, the passivation layer includes a region in which a thickness decreases from an outer peripheral portion toward a central part of the first surface, and wherein the passivation layer is not located on the central part when the first surface is seen in a perspective plan view.
2. The solar battery device according to claim 1, wherein the passivation layer of the laminated portion is in contact with the first surface.
3. The solar battery device according to claim 1, wherein the antireflection layer of the laminated portion is in contact with the first surface.
4. The solar battery device according to claim 1, wherein the passivation layer and the antireflection layer are in contact with each other within the laminated portion.

5. The solar battery device according to claim 1, wherein a reflectance for a wavelength range from blue light to ultraviolet light in the laminated portion decreases from the outer peripheral portion toward the central part on the first surface.

6. The solar battery device according to claim 1, wherein the antireflection layer is in contact with the central part of the first surface.

7. The solar battery device according to claim 1, wherein the passivation layer is located on the first surface, the second surface, and a third surface of the semiconductor substrate, the third surface connecting the first surface and the second surface.

8. The solar battery device according to claim 7, wherein a protective layer is located on the passivation layer on the second surface of the semiconductor substrate.

* * * * *